(12) United States Patent
Shimizu et al.

(10) Patent No.: US 6,201,952 B1
(45) Date of Patent: Mar. 13, 2001

(54) RADIO COMMUNICATION APPARATUS

(75) Inventors: Hiroaki Shimizu; Tatsuya Tokunaga, both of Tokyo; Kenichi Torii, Fujisawa; Toru Mizumoto, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/121,556

(22) Filed: Jul. 23, 1998

(30) Foreign Application Priority Data

Jul. 24, 1997 (JP) .................................................... 9-198396

(51) Int. Cl.[7] .............................. H04B 1/16; H04B 1/40; H04B 1/38; H04B 1/36
(52) U.S. Cl. ......................... 455/180.1; 455/84; 455/553; 455/314; 455/315
(58) Field of Search .............................. 455/76, 303, 314, 455/324, 553, 180.1, 183.1, 188.1, 190.1, 84, 86, 78, 260, 315, 317

(56) References Cited

U.S. PATENT DOCUMENTS

| 5,535,432 | * | 7/1996 | Dent ........................................ 455/77 |
| 5,974,302 | * | 10/1999 | Adamiecki et al. .................... 455/84 |
| 6,069,925 | * | 5/2000 | Koh ...................................... 375/344 |

* cited by examiner

Primary Examiner—Reinhard J. Eisenzopf
Assistant Examiner—Charles N. Appiah
(74) Attorney, Agent, or Firm—Finnegan, Henderson, Farabow, Garrett, & Dunner, L.L.P.

(57) ABSTRACT

A first local signal required for a downconverter of a reception system and an upconverter of a transmission system in a first band is generated by a synthesizer for generating a variable high frequency local signal. A second local signal required for a downconverter of a reception system and an upconverter of a transmission system in a second band is generated by mixing a signal generated by an oscillator for generating a signal at a relatively low fixed frequency with the first local signal using a mixer and filtering the result using a high-pass filter.

26 Claims, 14 Drawing Sheets

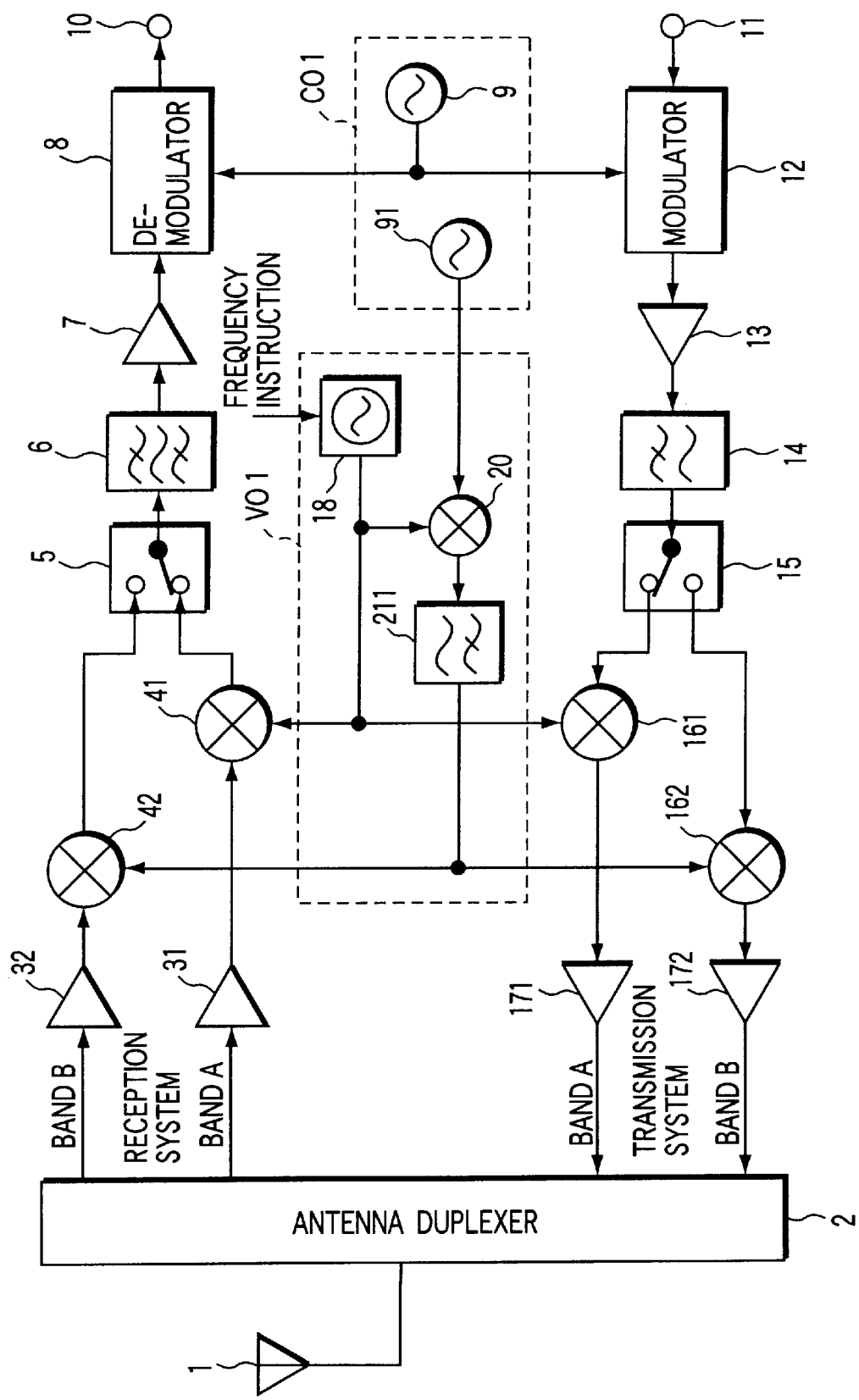
F I G. 2

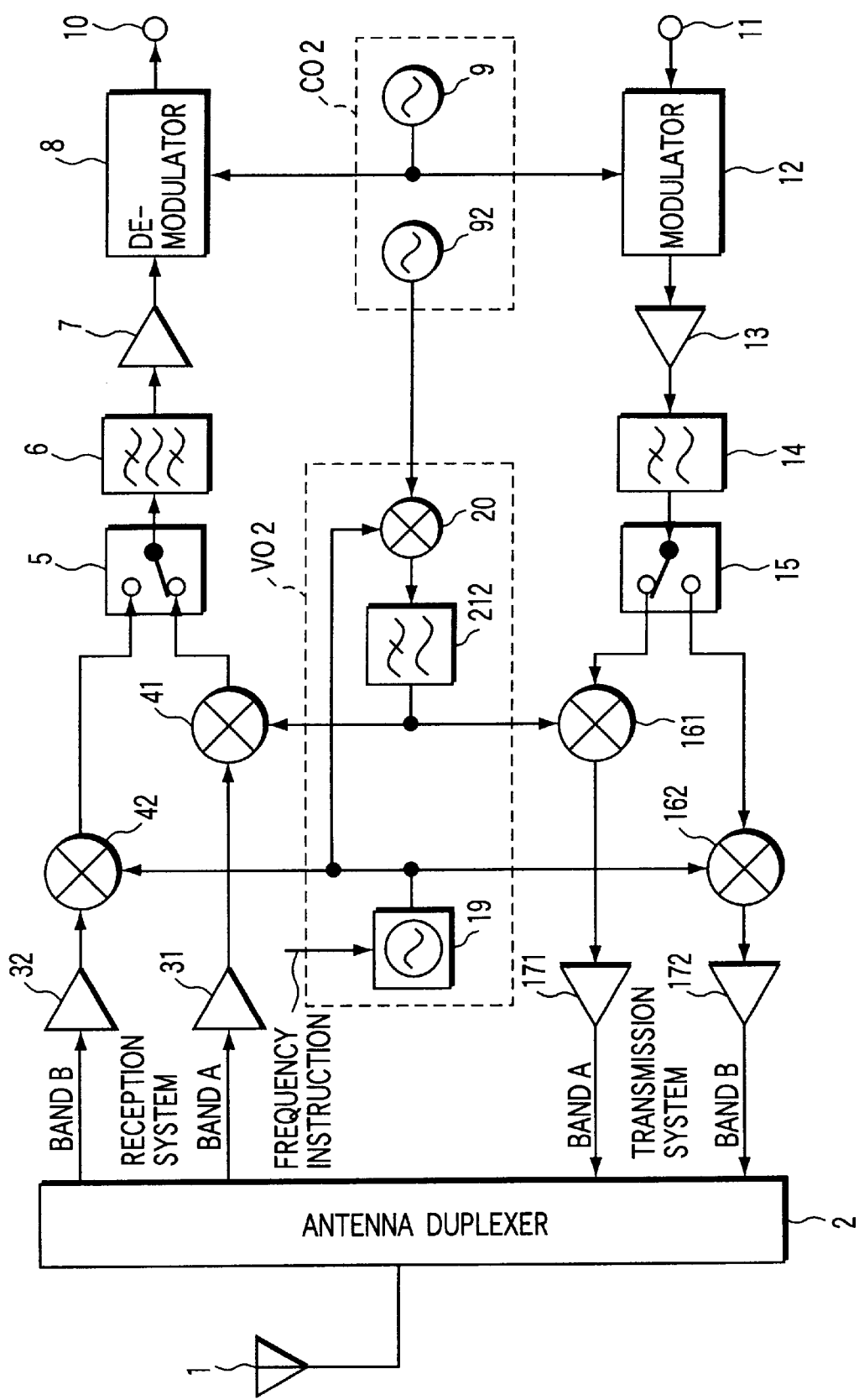
F I G. 3

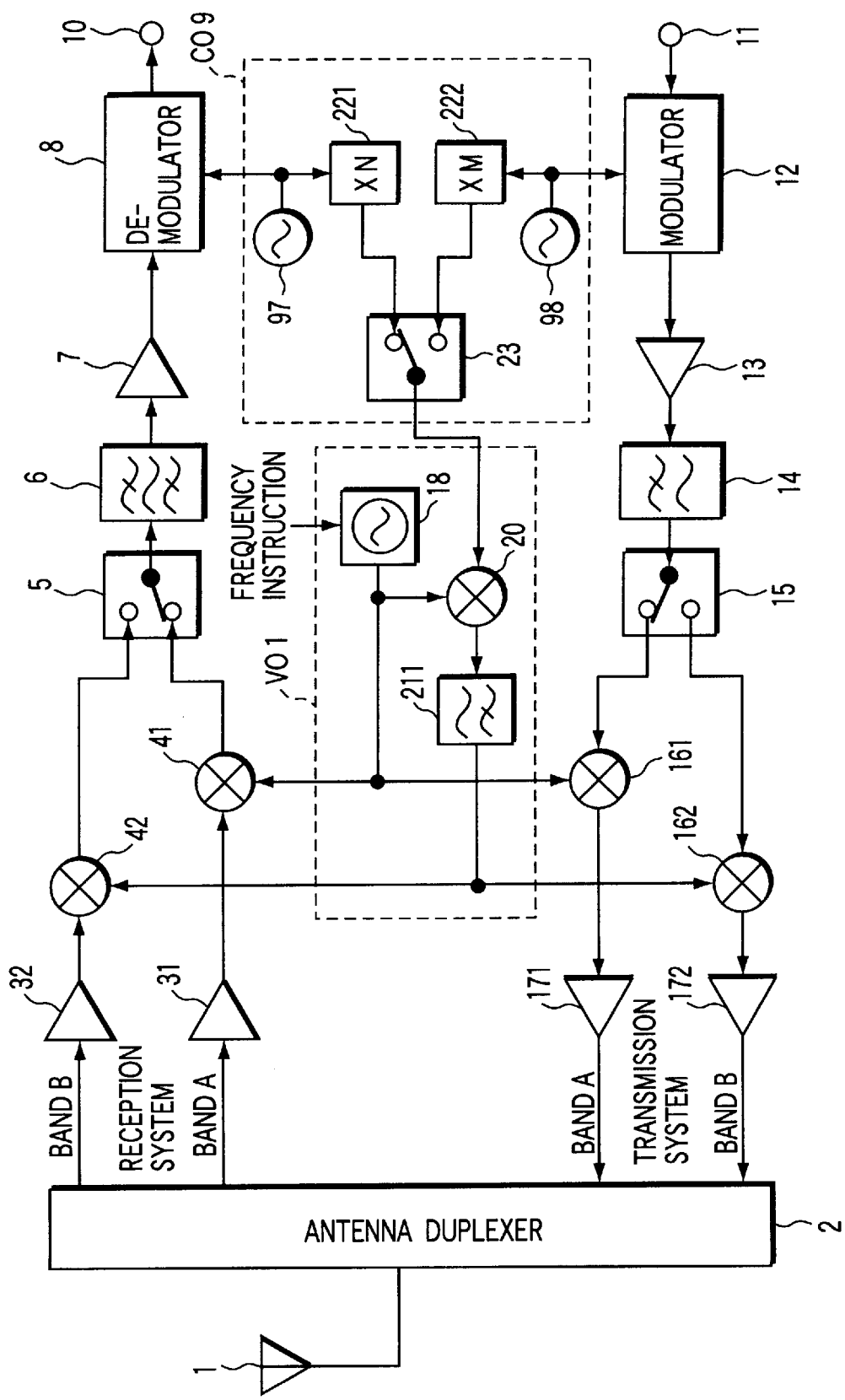
F I G. 10

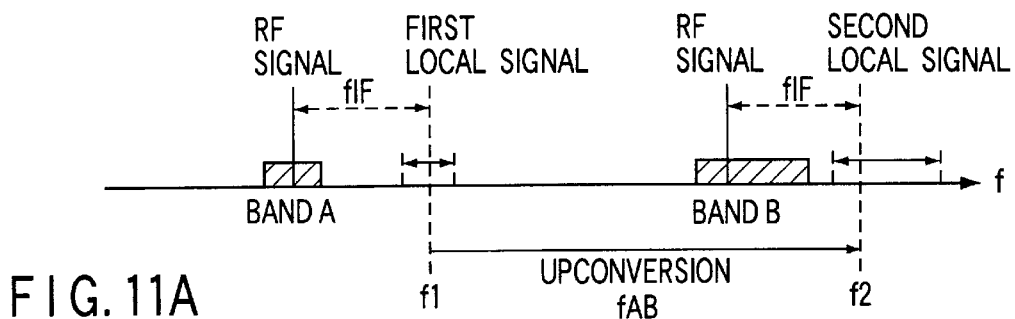
F I G. 11A
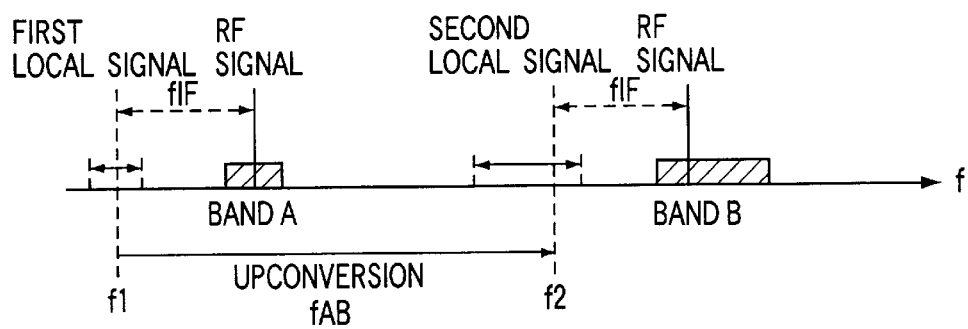
F I G. 11B
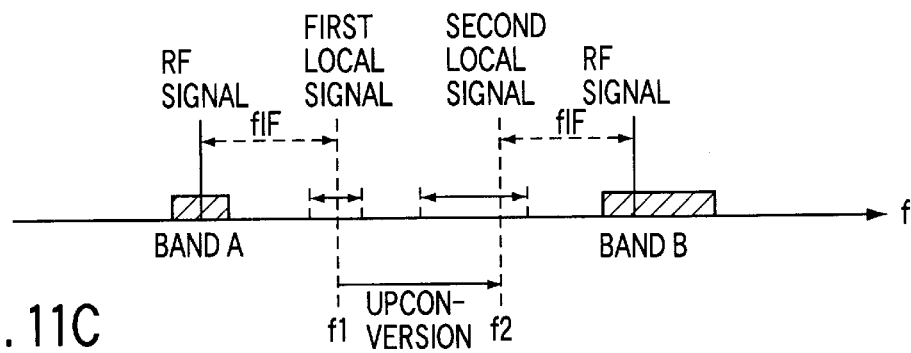
F I G. 11C
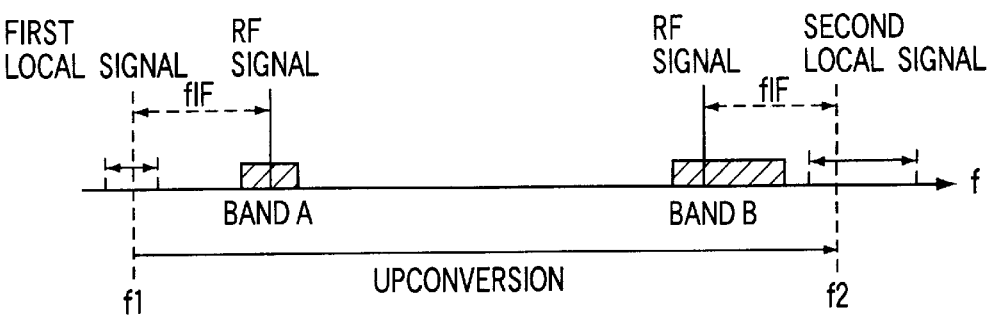
F I G. 11D

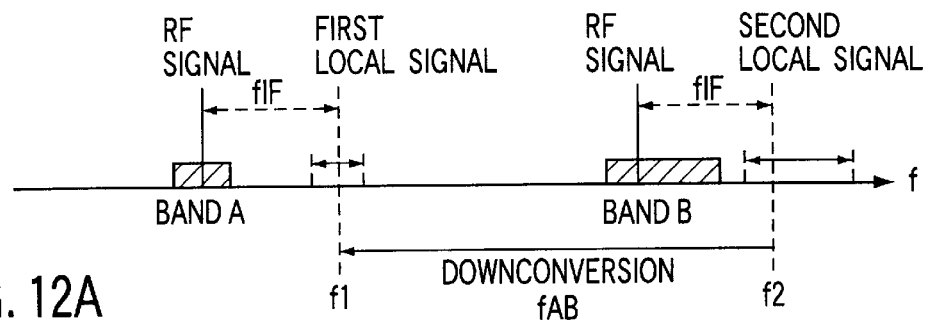
F I G. 12A
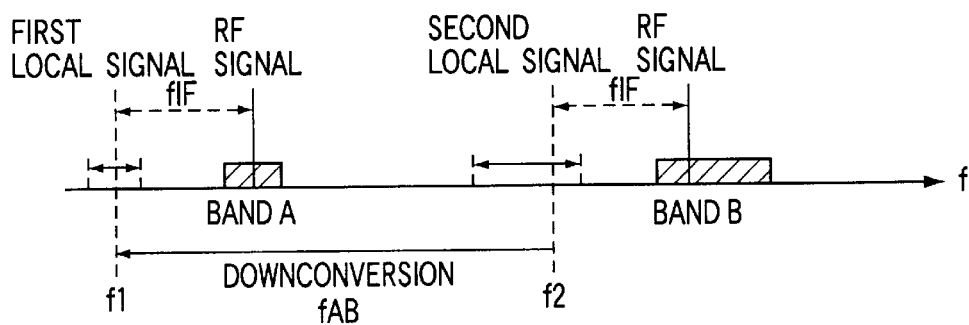
F I G. 12B
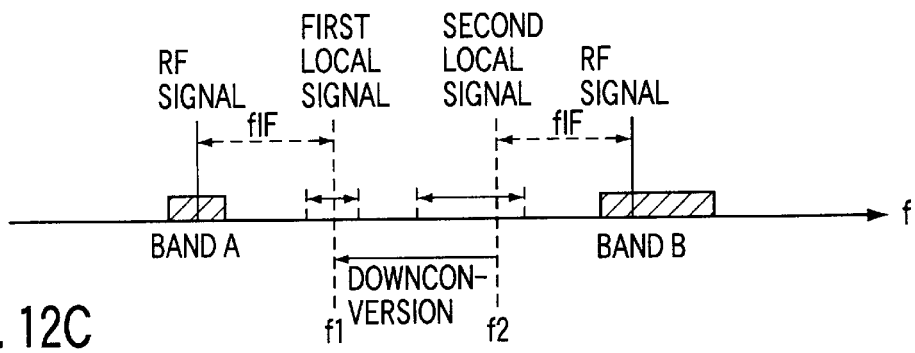
F I G. 12C
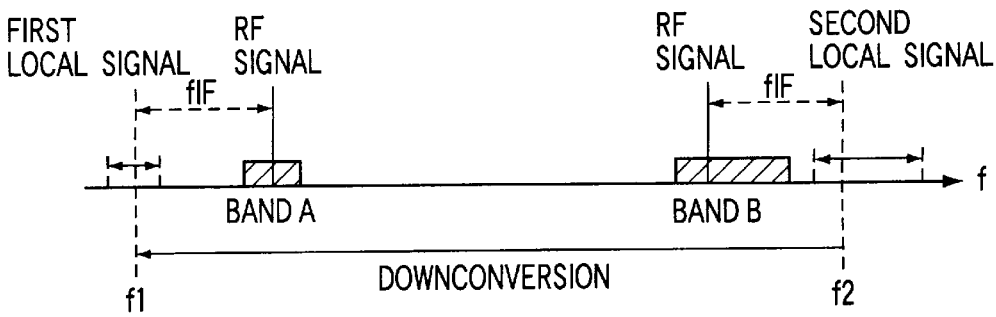
F I G. 12D

RADIO COMMUNICATION APPARATUS

BACKGROUND OF THE INVENTION

The present invention relates to a radio communication apparatus which allows communication by selectively using one of communication bands respectively used for two systems, for example, the GSM 900 (Global System for Mobile communication at 900 MHz) and the DCS 1800 (Digital Cellular System at 1800 MHz).

As is well known, there are radio communication apparatus which allows communication by selectively using one of communication bands respectively used for two radio communication systems. FIG. 1 shows a part of a basic configuration of a radio communication apparatus of this type, and a conventional communication apparatus will be described below with reference to FIG. 1.

An antenna 1 is an aerial capable of transmitting and receiving communication signals in communication bands A and B (hereinafter simply referred to as "band A" and "band B") used in two radio communication systems.

Signals received by the antenna 1 are separated by an antenna duplexer 2. A reception signal in the band A is input to a low-noise amplifier 31, and a reception signal in the band B is input to a low-noise amplifier 32.

The reception signal in the band A is amplified by the low-noise amplifier 31 and is mixed with a first local signal (local oscillation signal) generated by a first synthesizer 18 at a first downconverter 41 to be subjected to frequency conversion into an intermediate frequency.

The frequency-converted reception signal in the band A is input to a first input terminal of a switch 5 as a first reception IF signal.

The reception signal in the band B is amplified by the low-noise amplifier 32 and is mixed with a second local signal (local oscillation signal) generated by a second synthesizer 19 at a second downconverter 42 to be subjected to frequency conversion into an intermediate frequency. The frequency-converted reception signal in the band B is input to a second input terminal of the switch 5 as a second reception IF signal. The frequencies of the first and second local signals are adjusted such that the frequencies of the first and second reception IF signals become the same intermediate frequency.

The switch 5 selects either of signals input to the first and second input terminals, i.e., either the first or second IF signal in accordance with an instruction from a control portion which is not shown and outputs the signal to a band-pass filter 6.

The band-pass filter 6 places a band restriction on the input reception IF signal to eliminate noise components outside a transmission band.

The reception IF signal which has been band-restricted by the band-pass filter 6 is amplified by an amplifier 7 to a level appropriate for demodulation, demodulated by a demodulator 8 thereafter and input to a subsequent signal processor (not shown) through a signal output terminal 10.

The demodulator 8 demodulates the intermediate frequency signal into a baseband signal using a CW (continuous wave) signal generated by an oscillator 9.

A modulator 12 modulates the CW signal generated by the oscillator 9 using a modulation signal input by the signal processor through a signal input terminal 11 to output a transmission IF signal.

The transmission IF signal is amplified by an amplifier 13 to an appropriate level, thereafter supplied to a low-pass filter to eliminate noise components and harmonic components which are unnecessary for transmission, and input to a switch 15.

The switch 15 is switched under control of a control portion which is not shown depending on the transmission band of the transmission IF signal to output the transmission IF signal to a first upconverter 161 or a second downconverter 162 selectively.

The first upconverter 161 mixes the first local signal generated by the first synthesizer 18 with the reception IF signal to convert it into a high frequency signal in the band A.

The high frequency signal in the band A is subjected to power amplification at a first power amplifier 171 and is then emitted into the air through the antenna duplexer 2 and antenna 1.

The second upconverter 162 mixes the second local signal generated by the second synthesizer 19 with the transmission IF signal to convert it into a high frequency signal in the band B.

The high frequency signal in the band B is subjected to power amplification at a second power amplifier 172 and is then emitted into the air through the antenna duplexer 2 and the antenna 1.

The local signals generated by the first synthesizer 18 and second synthesizer 19 are set at frequencies which are required for frequency conversion on the transmission IF signals to covert them into high frequency signal in the bands A and B, respectively.

The above-described configuration allows the conventional radio communication apparatus to perform communication using a communication signal in the band A or B selectively through control over the switches 5 and 15.

In case that the radio communication apparatus having the above-described configuration is a mobile communication apparatus or the like, the quality of communication over the unselected band may be monitored during communication in preparation for hand-over and, alternatively, the quality of communication over the two bands may be monitored during standby.

It is thus common to switch bands for reception quickly when signals in two bands are to be received. When such high speed switching of reception bands is performed, in order to eliminate the influence of insufficient activation of the synthesizers (synthesizers 18 and 19 in FIG. 1), it is necessary to operate the synthesizer associated with the band to be monitored in addition to the synthesizer for the band in communication prior to monitoring or to cause both of the two synthesizers to operate from the beginning.

However, when the synthesizers 18 and 19 which generate variable high frequency local signals are operated, problem arises in that power consumption is increased. This is a serious problem especially for a mobile communication apparatus whose continuous running time is limited.

This problem occurs not only in the reception system but also in the case wherein two transmission systems are run with synthesizers operated in association therewith.

Further, this problem occurs not only in single superheterodyne type radio communication apparatuses as shown in FIG. 1 but also in a radio communication apparatus which comprises at least two synthesizer for receiving signals in two bands simultaneously, such as double superheterodyne radio communication apparatuses and TDD (Time Division Duplex) type radio communication apparatuses.

In a conventional radio communication apparatus, when two reception systems are operated simultaneously or switched at a high speed to be operated in order to monitor two communication bands, a problem has arisen in that power consumption is increased because two synthesizers must always be operated to variably generate high frequency local signals.

BRIEF SUMMARY OF THE INVENTION

The present invention has been conceived to solve the above-described problem, and it is an object of the invention to provide a radio communication apparatus in which two reception systems can be simultaneously operated or switched at a high speed to be operated with the power consumption of synthesizers reduced.

According to one aspect of the present invention, there is provided a radio communication apparatus which performs communication using at least either a first communication band used for a first radio communication system or a second communication band used for a second communication system, comprising:

first local oscillation signal generation means for generating a local oscillation signal at a variable frequency and outputting it as a first local oscillation signal;

second local oscillation signal generation means for generating a local oscillation signal at a predetermined frequency;

local oscillation frequency conversion means for performing frequency conversion on the first local oscillation signal by mixing it with the local oscillation signal generated by the second local oscillation signal generation means and for outputting the result of the conversion as a second local oscillation signal;

first frequency conversion means for downconverting the received first RF signal into a communication signal by mixing the received first RF signal with the first local oscillation signal; and second frequency conversion means for downconverting the received second RF signal into the communication signal by mixing the received second RF signal with the second local oscillation signal.

According to another aspect of the present invention, there is provided a radio communication apparatus which performs communication using at least either a first communication band used for a first radio communication system or a second communication band used for a second communication system, comprising:

first local oscillation signal generation means for generating a local oscillation signal at a variable frequency and outputting it as a first local oscillation signal;

second local oscillation signal generation means for generating a local oscillation signal at a predetermined frequency;

local oscillation frequency conversion means for performing frequency conversion on the first local oscillation signal by mixing it with the local oscillation signal generated by the second local oscillation signal generation means and for outputting the result of the conversion as a second local oscillation signal;

first frequency conversion means for upconverting a communication signal into a first RF signal in the first band by mixing the communication signal with the first local oscillation signal; and second frequency conversion means for upconverting the communication signal into a second RF signal in the second band by mixing the communication signal with the second local oscillation signal.

According to the invention, the local oscillation frequency conversion means comprises mixing means for mixing the first local oscillation signal with the local oscillation signal generated by the second local oscillation generation means and filter means for outputting low frequency (or high frequency) side-band components from among high frequency side-band components and low frequency side-band components output based on the result of mixing by the mixing means as the local oscillation signal.

In the radio communication apparatus having the above-described configuration, the frequency of the communication signal in the first communication band is converted using the first local oscillation signal generated by the first local oscillation signal generation means, and the frequency of the communication signal in the second communication band is converted using the second local oscillation signal generated by mixing the first local oscillation signal with the local oscillation signal generated by the second local oscillation signal generation means.

That is, the radio communication apparatus having the above-described configuration uses the first local oscillation signal generation means that can generate a local oscillation signal having a variable frequency, and the second local oscillation signal generation means that can generate a local oscillation signal having a predetermined frequency lower than the frequency of the local oscillation signal generated by the first local oscillation signal generation means.

Therefore, for example, when reception (transmission) is performed by switching the first communication band used for the first radio communication system and the second communication band used for the second radio communication system at a high speed or when those two communication bands are received (transmitted) simultaneously, the radio communication apparatus having the above-described configuration needs only one means for variably generating a local oscillation signal having a high frequency which requires a high power consumption, unlike the conventional radio communication radio apparatus which needs two means for variably generating the local oscillation signal having a high frequency. Accordingly, the power consumption of the radio communication apparatus having the above-described configuration is small.

According to another aspect of the invention, there is provided a radio communication apparatus which performs communication using at least either a first communication band used for a first radio communication system or a second communication band used for a second communication system, comprising:

first local oscillation signal generation means for generating a local oscillation signal at a variable frequency;

second local oscillation signal generation means for generating a local oscillation signal at a predetermined frequency;

local oscillation frequency conversion means for performing frequency conversion on the local oscillation signal generated by the first local oscillation signal generation means by mixing it with the local oscillation signal generated by the second local oscillation signal generation means;

first filter means for outputting low frequency side-band components, as a first local oscillation signal, from among high frequency side-band components and low frequency side-band components output as a result of the conversion at the local oscillation frequency conversion means;

second filter means for outputting high frequency side-band components, as a second local oscillation signal, from among high frequency side-band components and low frequency side-band components output as a result of the conversion at the local oscillation frequency conversion means;

first frequency conversion means for downconverting the received first RF signal into a communication signal by mixing the received first RF signal with the first local oscillation signal; and second frequency conversion means for downconverting the received second RF signal into the communication signal by mixing the received second RF signal with the second local oscillation signal.

According to another aspect of the invention, there is provided a radio communication apparatus which performs communication using at least either a first communication band used for a first radio communication system or a second communication band used for a second communication system, comprising:

first local oscillation signal generation means for generating a local oscillation signal at a variable frequency;

second local oscillation signal generation means for generating a local oscillation signal at a predetermined frequency;

local oscillation frequency conversion means for performing frequency conversion on the local oscillation signal generated by the first local oscillation signal generation means by mixing it with the local oscillation signal generated by the second local oscillation signal generation means;

first filter means for outputting low frequency side-band components, as a first local oscillation signal, from among high frequency side-band components and low frequency side-band components output as a result of the conversion at the local oscillation frequency conversion means;

second filter means for outputting high frequency side-band components, as a second local oscillation signal, from among high frequency side-band components and low frequency side-band components output as a result of the conversion at the local oscillation frequency conversion means;

first frequency conversion means for upconverting a communication signal into a first RF signal in the first band by mixing the communication signal with the first local oscillation signal; and second frequency conversion means for upconverting the communication signal into a second RF signal in the second band by mixing the communication signal with the second local oscillation signal.

In the radio communication apparatus having the above-described configuration, the local oscillation signal generated by the first local oscillation signal generation means is subjected to frequency conversion by mixing it with the local oscillation signal generated by the second local oscillation signal generation means; the result of the conversion is subjected to, for example, filtering to separate and extract each of high frequency side-band components and low frequency side-band components included in the result of conversion; and the frequencies of the communication signals in the first and second communication bands are converted using the respective side-band components.

That is, the radio communication apparatus having the above-described configuration uses the first local oscillation signal generation means that can generate a local oscillation signal having a variable frequency, and the second local oscillation signal generation means that can generate a local oscillation signal having a predetermined frequency lower than the frequency of the local oscillation signal generated by the first local oscillation signal generation means.

Therefore, for example, when reception (transmission) is performed by switching the first communication band used for the first radio communication system and the second communication band used for the second radio communication system at a high speed or when those two communication bands are received (transmitted) simultaneously, the radio communication apparatus having the above-described configuration needs only one means for variably generating a local oscillation signal having a high frequency which requires a high power consumption, unlike the conventional radio communication radio apparatus which needs two means for variably generating the local oscillation signal having a high frequency. Accordingly, the power consumption of the radio communication apparatus having the above-described configuration is small.

According to the present invention, the second local oscillation signal generation means is means for generating a local oscillation signal used for demodulation of a reception signal or modulation of a transmission signal.

A radio communication apparatus having the above-described configuration uses means for generating a local oscillation signal used for demodulation of a reception signal or modulation of a transmission signal as the second local oscillation signal generation means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit block diagram showing a configuration of a first embodiment of a radio communication apparatus according to the present invention.

FIG. 3 is a circuit block diagram showing a configuration of a second embodiment of a radio communication apparatus according to the present invention.

FIG. 10 is a circuit diagram showing still another configuration of a radio communication apparatus which is based on the configuration of the radio communication apparatus shown in FIG. 2 except that the local signal generation portion is improved.

FIGS. 11A through 11D show the relationship between communication bands of the radio communication apparatus shown in FIG. 2 and local signals.

FIGS. 12A through 12D show the relationship between communication bands of the radio communication apparatus shown in FIG. 3 and local signals.

DETAILED DESCRIPTION OF THE INVENTION

An embodiment of the present invention will now be described with reference to the drawings.

Figure 1:
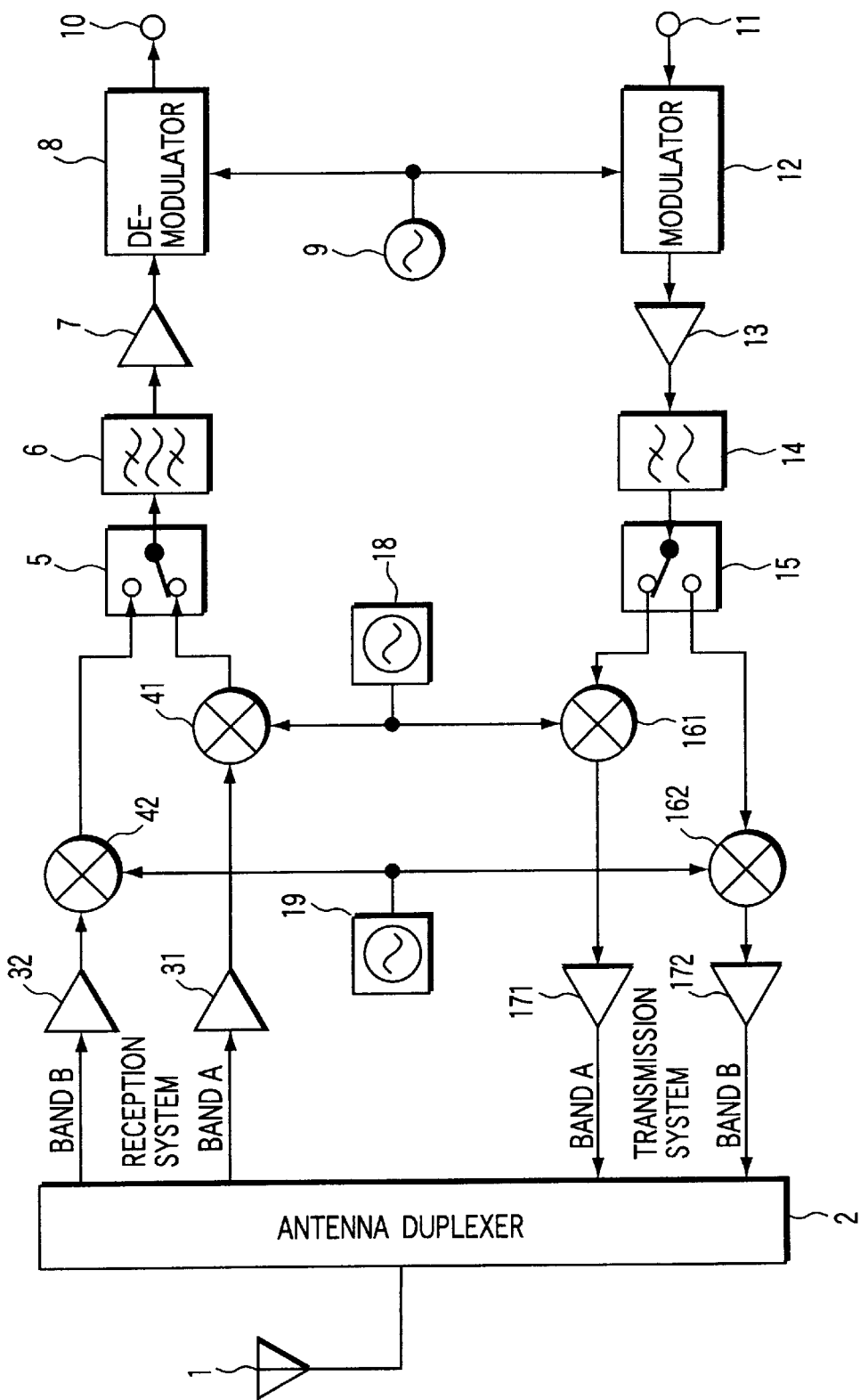
FIG. 1 is a circuit block diagram showing a configuration of a conventional radio communication apparatus.

FIG. 2 shows a configuration of a radio communication apparatus according to a first embodiment of the present invention. In FIG. 2, like parts as in FIG. 1 showing a configuration of a conventional radio communication apparatus are indicated by like reference numbers.

An antenna 1 is an aerial which is capable of transmitting and receiving communication signals in communication bands (bands A and B) used for two respective radio communication systems.

The band A is a band at a frequency lower than that of the band B and is a communication band of, for example, GSM 900 (Global System for Mobile communication at 900 MHz) in accordance with the GSM standard which is a standard recommended by ETSI (European Telecommunications Standards Institute). The band B is a communication band of, for example, DCS 1800 (Digital Cellular System at 1800 MHz).

A total band width of 70 MHz is allocated for use in the GSM 900. A band width of 35 MHz from 880 to 915 MHz is used for transmission, whereas a band width of 35 MHz from 925 to 960 MHz is used for reception.

A total band width of 150 MHz is allocated for use in the DCS 1800. A band width of 75 MHz from 1710 to 1785 MHz is used for transmission, whereas a band width of 75 MHz from 1805 to 1880 MHz is used for reception.

The carrier frequency interval is 200 kHz for both of the GSM 900 and DCS 1800.

Reception RF signals in two communication bands received by the antenna 1 are separated by an antenna duplexer 2. A reception RF signal in the band A is input to a low noise amplifier 31, and a reception RF signal in the band B is input to a low noise amplifier 32.

The reception RF signal in the band A is amplified by the low noise amplifier 31 and input to a first downconverter 41. On the other hand, the reception RF signal in the band B is amplified by the low noise amplifier 32 and input to a second downconverter 42.

The first downconverter 41 mixes the reception RF signal in the band A amplified by the low noise amplifier 31 with a first local signal generated by a local signal generation portion VO1 to be described later to covert the frequency thereof, thereby obtaining a first reception IF signal at an intermediate frequency $f_{IF}$. The first reception IF signal is input to a first input terminal of a switch 5.

Similarly, the second downconverter 42 mixes the reception RF signal in the band B amplified by the low noise amplifier 32 with a second local signal generated by the local signal generation portion VO1 to covert the frequency thereof, thereby obtaining a second reception IF signal at the intermediate frequency $f_{IF}$. The second reception IF signal is input to a second input terminal of the switch 5.

The switch 5 is switched under control of a control portion which is not shown in accordance with instructions therefrom to select either of the signals input to the first and second input terminals, i.e., either of the first and second reception IF signals and to output the selected signal to a band-pass filter 6.

The band-pass filter 6 performs band restriction on the input reception IF signal to eliminate noise components outside a transmission band.

The reception IF signal whose band has been restricted by the band-pass filter 6 is amplified by an amplifier 7 to a level appropriate for demodulation, demodulated by a demodulator 8 and input to a subsequent signal processing portion (not shown) through a signal output terminal 10.

The demodulator 8 demodulates a the intermediate frequency signal into a baseband signal using a CW signal at a predetermined frequency generated by an oscillator 9 of a local signal generation portion CO1.

A modulator 12 modulates the CW signal generated by the oscillator 9 using a modulation signal input from the signal processing portion through a signal input terminal 11 to output a transmission IF signal.

The transmission IF signal is amplified by an amplifier 13 to an appropriate level and is input to a switch 15 via a low-pass filter 14 which eliminates noise components and harmonic components unnecessary for transmission.

The switch 15 is controlled by a control portion, which is not shown, to be switched to provide output in accordance with the band in which the transmission IF signal is to be transmitted. It selectively outputs the transmission IF signal to a first upconverter 161 or a second upconverter 162.

The first upconverter 161 mixes the first local signal generated by the local signal generation portion VO1 with the transmission IF signal to convert it into a high frequency signal in the band A. The result of this conversion is output to a first power amplifier 171 as a first transmission RF signal.

Similarly, the second upconverter 162 mixes the second local signal generated by the local signal generation portion VO1 with the transmission IF signal to convert it into a high frequency signal in the band B. The result of this conversion is output to a second power amplifier 172 as a second transmission RF signal.

The first and second transmission RF signals are subjected to power amplification at the first and second power amplifiers 171 and 172, respectively, and are radiated into the air through the antenna duplexer 2 and antenna 1.

The local signal generation portion VO1 generates the first and second local signals and includes a synthesizer 18, a mixer 20 and a high-pass filter 211. The local signal generation portion CO1 includes the oscillator 9 described above and an oscillator 91.

The synthesizer 18 generates a local signal at a frequency $f_1$ specified by a control portion which is not shown (hereinafter referred to as "first local signal") and outputs it to the first downconverter 41, the first upconverter 161 and the mixer 20.

As shown in FIG. 11A, the frequency $f_1$ is a frequency which is higher than that of the RF signal used for communication over the band A by the amount of the intermediate frequency $f_{IF}$.

For example, the oscillator 91 generates a local signal at a frequency corresponding to a frequency difference $f_{AB}$ between the RF signals used for communication over the bands A and B and outputs it to the mixer 20, as shown in FIG. 11A.

The mixer 20 mixes the first local signal with the local signal generated by the oscillator 91 to convert the frequency of the first local signal.

The result of this conversion consists of side-band components at a frequency higher than the frequency $f_1$ of the first local signal by the frequency $f_{AB}$ and side-band components at a frequency lower than the frequency $f_1$ of the first local signal by the frequency $f_{AB}$. The result is input to the high-pass filter 211 which extracts only the side-band components at the higher frequency and inputs them to the second downconverter 42 and the second upconverter 162 as a second local signal (whose frequency is represented by $f_2$).

As described above, in a radio communication apparatus having the above-described configuration, the first local signal is generated by the synthesizer 18, and the second local signal is generated by mixing the first local signal with the local signal generated by the oscillator 91 to up-convert the same.

That is, the first and second local signals are generated by a single synthesizer capable of generating a local signal at a variable high frequency (which corresponds to the synthesizer 18) and an oscillator (corresponding to the oscillator 91) for generating a local signal at a frequency lower than that generated by the synthesizer (by an amount corresponding to the difference between the frequencies of the two communication bands).

Therefore, the power consumption of a radio communication apparatus having the above described configuration can be less than that in the prior art because it requires only one synthesizer for generating a local signal at a variable high frequency when reception RF signals in communication bands used for two respective radio communication systems are to be received on a quickly switched basis or simultaneously.

Further, the power consumption of a radio communication apparatus having the above described configuration can be less than that in the prior art also when communication bands used for two respective radio communication systems are to be transmitted on a quickly switched basis or simultaneously because it requires only one synthesizer for generating a local signal at a variable high frequency.

The first embodiment is not limited to the above-described configuration. For example, the relationship illustrated in FIG. 11A was described as an example of the relationship between the frequencies of the first and second local signals and the bands A and B.

Alternatively, as shown in FIG. 11B, a local signal at a frequency $f_1$ which is lower than the RF signal in the band A by the intermediate frequency $f_{IF}$ may be used as the first local signal, and a local signal at a frequency $f_2$ which is lower than the RF signal in the band B by the intermediate frequency $f_{IF}$ may be used as the second local signal. In this case, the local signal at the frequency $f_2$ can be obtained by up-converting the first local signal to a higher frequency side by the amount of the frequency difference $f_{AB}$.

Alternatively, as shown in FIG. 11C, a local signal at a frequency $f_1$ which is higher than the RF signal in the band A by the intermediate frequency $f_{IF}$ may be used as the first local signal, and a local signal at a frequency $f_2$ which is obtained by up-converting the first local signal to a frequency lower than the RF signal in the band B by the intermediate frequency $f_{IF}$ may be used as the second local signal.

Further, as shown in FIG. 11D, a local signal at a frequency $f_1$ which is lower than the RF signal in the band A by the intermediate frequency $f_{IF}$ may be used as the first local signal, and a local signal at a frequency $f_2$ which is obtained by up-converting the first local signal to a frequency higher than the RF signal in the band B by the intermediate frequency $f_{IF}$ may be used as the second local signal.

Obviously, the same effect can be achieved when each of the frequencies is set such that the relationship between the first and second local signals and the bands A and B is changed from that shown in FIG. 11A to that shown in any of FIGS. 11B, 11C and 11D.

Moreover, while the radio communication apparatus shown in FIG. 2 generates the two local signals by upconverting one of the local signals at the local signal generation portion VO1 to generate the other local signal, one of the local signals may alternatively be generated by downconverting the other local signal.

A description will now be made on a radio communication apparatus wherein one of local signals is downconverted to generate another local signal, as a second embodiment of the present invention. FIG. 3 shows an example of a configuration of the same.

The radio communication apparatus shown in FIG. 3 includes a local signal generation portion VO2 and a local signal generation portion CO2 in place of the local signal generation portion VO1 and local signal generation portion CO1 in FIG. 2, respectively.

The local signal generation portion VO2 includes a synthesizer 19, a mixer 20 and a low-pass filter 212, and the local signal generation portion CO2 includes oscillators 9 and 92.

The synthesizer 19 generates a local signal at a frequency $f_2$ specified by the control portion which is not shown and outputs it to a second downconverter 42, a second upconverter 162 and the mixer 20.

As shown in FIG. 12A, the frequency $f_2$ is a frequency which is higher than that of the RF signal used for communication over the band B by an amount of the intermediate frequency $f_{IF}$.

For example, the oscillator 92 generates a local signal at a frequency corresponding to a frequency difference $f_{AB}$ between the RF signals used for communication over the bands A and B and outputs it to the mixer 20, as shown in FIG. 12A.

The mixer 20 mixes the second local signal with the local signal generated by the oscillator 92 to convert the frequency of the second local signal.

The result of this conversion consists of side-band components at a frequency higher than the frequency $f_2$ of the second local signal by the frequency $f_{AB}$ and side-band components at a frequency lower than the frequency $f_2$ of the second local signal by the frequency $f_{AB}$. The result is input to the low-pass filter 212 which extracts only the side-band components at the lower frequency and inputs them to a first downconverter 41 and a first upconverter 161 as a first local signal (whose frequency is represented by $f_1$).

As described above, in a radio communication apparatus having the above-described configuration, the second local signal is generated by the synthesizer 19, and the first local signal is generated by mixing the second local signal with the local signal generated by the oscillator 92 to downconvert the same.

That is, the first and second local signals are generated by a single synthesizer capable of generating a local signal at a variable high frequency (which corresponds to the synthesizer 19) and an oscillator (corresponding to the oscillator 92) for generating a local signal at a predetermined frequency (the difference between the frequencies of the two communication bands).

Therefore, the power consumption of a radio communication apparatus having the above described configuration can be less than that in the prior art because it requires only one synthesizer for generating a local signal at a variable high frequency when reception RF signals in two communication bands are to be received on a quickly switched basis or simultaneously, as in the radio communication apparatus having the local signal generation portion VO1 described above.

Similarly, the power consumption of a radio communication apparatus having the above described configuration can be less than that in the prior art also when transmission signals in two communication bands are to be transmitted on a quickly switched basis or simultaneously because it requires only one synthesizer for generating a local signal at a variable high frequency.

The second embodiment is not limited to the above-described configuration. For example, the relationship illustrated in FIG. 12A was described as an example of the relationship between the frequencies of the first and second local signals and the bands A and B.

Alternatively, as shown in FIG. 12B, a local signal at a frequency $f_2$ which is lower than the RF signal in the band B by the intermediate frequency $f_{IF}$ may be used as the second local signal, and a local signal at a frequency $f_1$ which is lower than the RF signal in the band A by the intermediate frequency $f_{IF}$ may be used as the first local signal. In this case, the local signal at the frequency $f_1$ can be obtained by downconverting the second local signal to a lower frequency side by the amount of the frequency difference $f_{AB}$.

Alternatively, as shown in FIG. 12C, a local signal at a frequency $f_2$ which is lower than the RF signal in the band B by the intermediate frequency $f_{IF}$ may be used as the second local signal, and a local signal at a frequency $f_1$ may be used as the first local signal. In this case, the local signal at the frequency $f_1$ is obtained by downconverting the second local signal to a frequency higher than the RF signal in the band A by the intermediate frequency $f_{IF}$.

Further, as shown in FIG. 12D, a local signal at a frequency $f_2$ which is higher than the RF signal in the band B by the intermediate frequency $f_{IF}$ may be used as the second local signal, and a local signal at a frequency $f_1$ may be used as the first local signal. In this case, the local signal at the frequency $f_1$ is obtained by downconverting the second local signal to a frequency lower than the RF signal in the band A by the intermediate frequency $f_{IF}$.

Obviously, the same effect can be achieved when each of the frequencies is set such that the relationship between the first and second local signals and the bands A and B is changed from that shown in FIG. 12A to that shown in any of FIGS. 12B, 12C and 12D.

Figure 4:
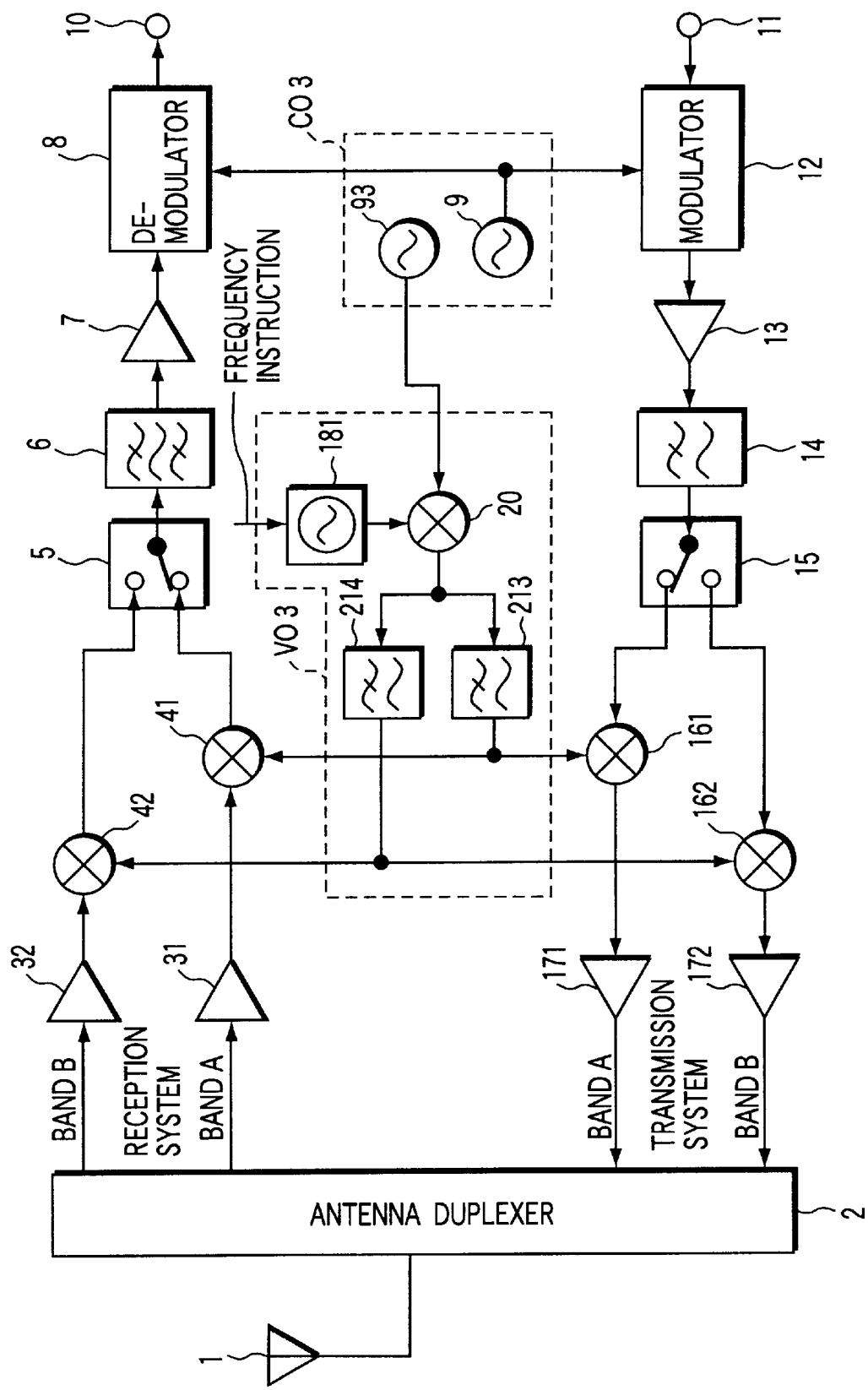
FIG. 4 is a circuit block diagram showing a configuration of a third embodiment of a radio communication apparatus according to the present invention.

A description will now be made on a radio communication apparatus according to a third embodiment of the present invention. FIG. 4 shows a configuration of the same in which parts identical to those in the configuration of the radio communication apparatus shown in FIG. 2 are indicated by like reference numbers.

Reception RF signals in two communication bands (bands A and B) received by an antenna 1 are separated by an antenna duplexer 2. A reception RF signal in the band A is input to a low noise amplifier 31, and a reception RF signal in the band B is input to a low noise amplifier 32.

The reception RF signal in the band A is amplified by the low noise amplifier 31 and input to a first downconverter 41. On the other hand, the reception RF signal in the band B is amplified by the low noise amplifier 32 and input to a second downconverter 42.

The first downconverter 41 mixes the reception RF signal in the band A amplified by the low noise amplifier 31 with a first local signal generated by a local signal generation portion VO3 to be described later to covert the frequency thereof, thereby obtaining a first reception IF signal at an intermediate frequency $f_{IF}$. The first reception IF signal is input to a first input terminal of a switch 5.

Similarly, the second downconverter 42 mixes the reception RF signal in the band B amplified by the low noise amplifier 32 with a second local signal generated by the local signal generation portion VO3 to covert the frequency thereof, thereby obtaining a second reception IF signal at the intermediate frequency $f_{IF}$. The second reception IF signal is input to a second input terminal of the switch 5.

The switch 5 is switched under control of a control portion which is not shown in accordance with instructions therefrom to select either of the signals input to the first and second input terminals, i.e., either of the first and second reception IF signals and to output the selected signal to a band-pass filter 6.

The band-pass filter 6 performs band restriction on the input reception IF signal to eliminate noise components outside a transmission band.

The reception IF signal whose band has been restricted by the band-pass filter 6 is amplified by an amplifier 7 to a level appropriate for demodulation, demodulated by a demodulator 8 and input to a subsequent signal processing portion (not shown) through a signal output terminal 10.

The demodulator 8 demodulates a the intermediate frequency signal into a baseband signal using a CW signal at a predetermined frequency generated by an oscillator 9 of a local signal generation portion CO3.

A modulator 12 modulates the CW signal generated by the oscillator 9 using a modulation signal input from the signal processing portion through a signal input terminal 11 to output a transmission IF signal.

The transmission IF signal is amplified by an amplifier 13 to an appropriate level and is input to a switch 15 via a low-pass filter 14 which eliminates noise components and harmonic components unnecessary for transmission.

The switch 15 is controlled by a control portion, which is not shown, to be switched to provide output in accordance with the band in which the transmission IF signal is to be transmitted. It selectively outputs the transmission IF signal to a first upconverter 161 or a second upconverter 162.

The first upconverter 161 mixes the first local signal generated by the local signal generation portion VO3 with the transmission IF signal to convert it into a high frequency signal in the band A. The result of this conversion is output to a first power amplifier 171 as a first transmission RF signal.

Similarly, the second upconverter 162 mixes the second local signal generated by the local signal generation portion VO3 with the transmission IF signal to convert it into a high frequency signal in the band B. The result of this conversion is output to a second power amplifier 172 as a second transmission RF signal.

The first and second transmission RF signals are subjected to power amplification at the first and second power amplifiers 171 and 172, respectively, and are radiated into the air through the antenna duplexer 2 and the antenna 1.

The local signal generation portion VO3 generates the first and second local signals and includes a synthesizer 181, a mixer 20, a low-pass filter 213 and a high-pass filter 214. The local signal generation portion CO3 includes the oscillator 9 described above and an oscillator 93.

The synthesizer 181 generates a local signal L1 at a frequency $f_{L1}$ specified by a control portion which is not shown and outputs it to the mixer 20.

The mixer 20 mixes the local signal L1 with a local signal L2 at a frequency $f_{L2}$ generated by the oscillator 93 to convert the frequency thereof.

The result of this conversion consists of side-band components at a frequency lower than the frequency of the local signal L1 by the frequency $f_{L2}$ and side-band components at a frequency higher than the frequency of the local signal L1 by the frequency $f_{L2}$. The result is input to the low-pass filter 213 which extracts the lower side-band components and inputs them to the first downconverter 41 and the first upconverter 161 as a first local signal.

The result of the conversion is also input to the high-pass filter 214 which extracts the higher side-band components and inputs them to the second downconverter 42 and the second upconverter 162 as a second local signal.

Figure 13A:
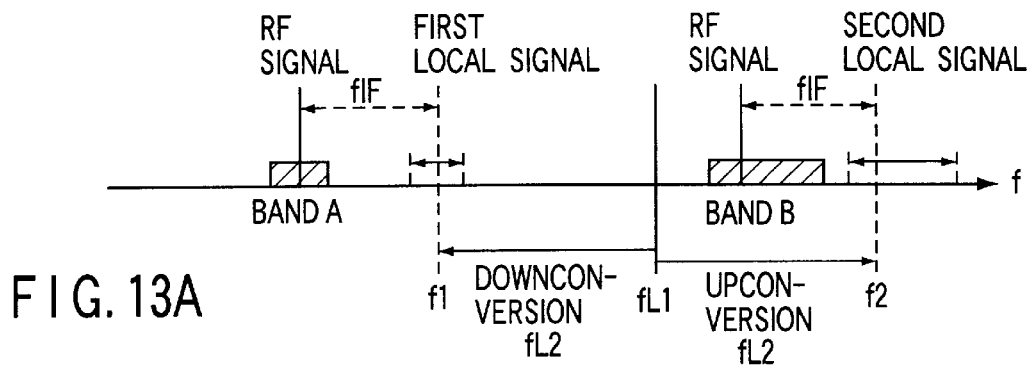
FIGS. 13A through 13D show the relationship between communication bands of the radio communication apparatus shown in FIG. 4 and local signals.

As shown in FIG. 13A, the frequency $f_{L1}$ of the local signal L1 and the frequency $f_{L2}$ of the local signal L2 are respectively set such that the first local signal will be at a frequency higher than that of the RF signal used for communication in the band A by the intermediate frequency $f_{IF}$ and such that the second local signal will be at a frequency higher than the RF signal used for communication in the band B by the intermediate frequency $f_{IF}$.

As described above, in a radio communication apparatus having the above-described configuration, the local signals required respectively for the two downconverters 41 and 42 in the reception system (the first and second local signals) are generated by mixing the local signal L1 generated by the synthesizer 181 and the local signal L2 generated by the oscillator 93.

Therefore, the power consumption of a radio communication apparatus having the above described configuration can be less than that in the prior art because it requires only one synthesizer for generating a local signal at a variable high frequency (which corresponds to the synthesizer 181) even when reception RF signals in two bands are to be received on a quickly switched basis or simultaneously.

Further, this configuration allows power consumption less than that in the prior art even when transmission signals in two bands are to be transmitted on a quickly switched basis or simultaneously because it requires only one synthesizer for generating a local signal at a variable high frequency.

The third embodiment is not limited to the above-described configuration. For example, the relationship illustrated in FIG. 13A was described as an example of the relationship between the frequencies of the first and second local signals and the bands A and B.

Figure 13B:
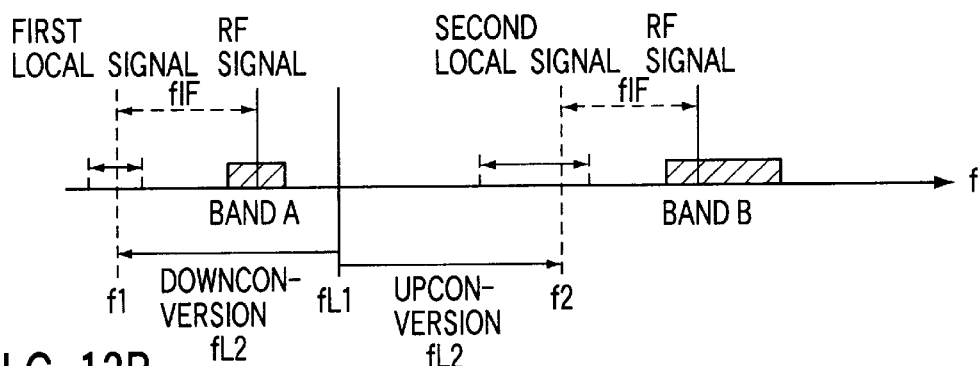

Alternatively, as shown in FIG. 13B, the frequency $f_{L1}$ of the local signal L1 and the frequency $f_{L2}$ of the local signal L2 may be set respectively such that the first local signal will be at a frequency lower than that of the RF signal used for communication in the band A by the intermediate frequency $f_{IF}$ and such that the second local signal will be at a frequency lower than that of the RF signal used for communication in the band B by the intermediate frequency $f_{IF}$.

Figure 13C:
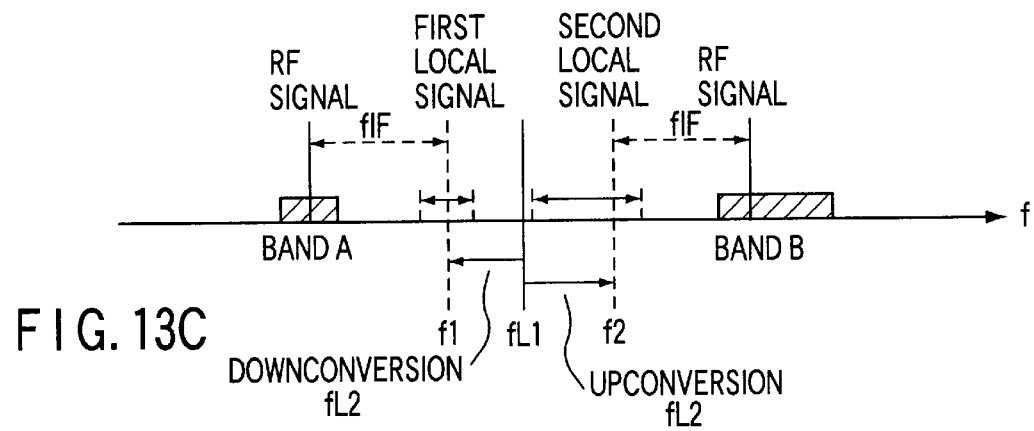

Alternatively, as shown in FIG. 13C, the frequency $f_{L1}$ of the local signal L1 and the frequency $f_{L2}$ of the local signal L2 may be set respectively such that the first local signal will be at a frequency higher than that of the RF signal used for communication in the band A by the intermediate frequency $f_{IF}$ and such that the second local signal will be at a frequency lower than that of the RF signal used for communication in the band B by the intermediate frequency $f_{IF}$.

Figure 13D:
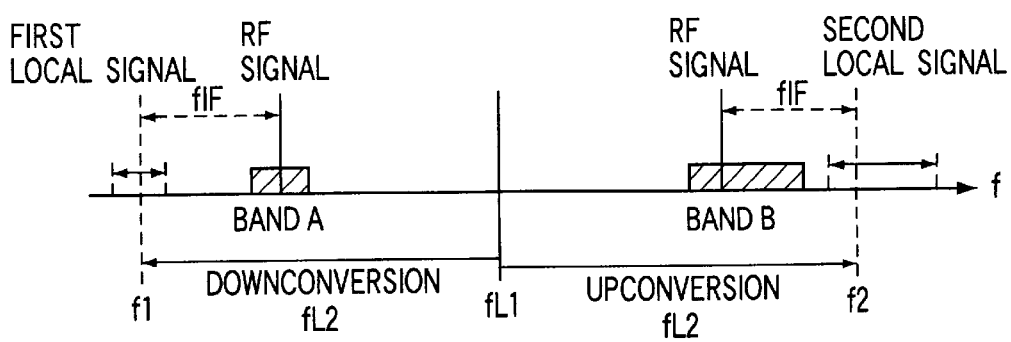
Figure 14A:
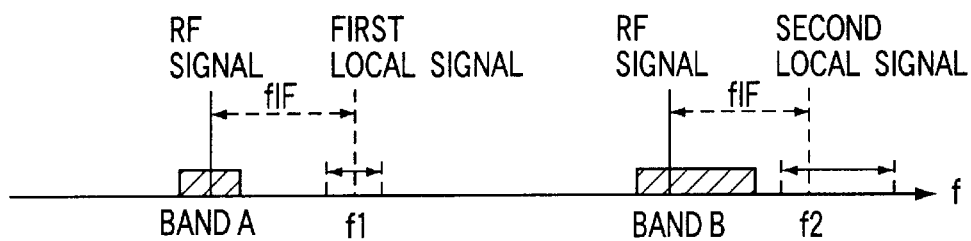
FIGS. 14A through 14D show the relationship between the communication bands of the radio communication apparatuses shown in FIGS. 5 through 10 and the frequencies of local signals.
Figure 14B:
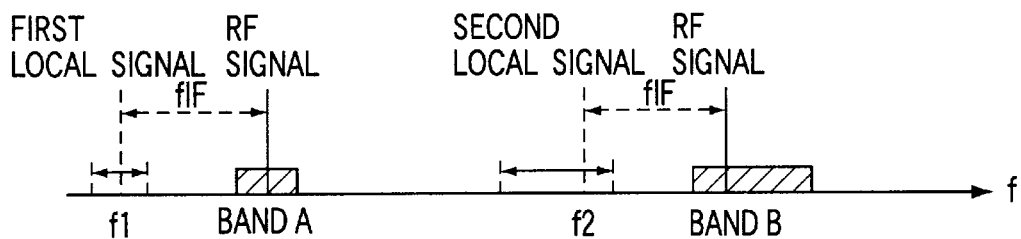
Figure 14C:
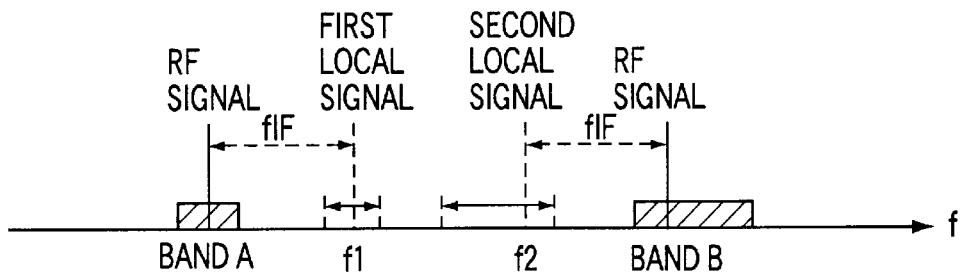
Figure 14D:

Further, as shown in FIG. 13D, the frequency $f_{L1}$ of the local signal L1 and the frequency $f_{L2}$ of the local signal L2 may be set respectively such that the first local signal will be at a frequency lower than that of the RF signal used for communication in the band A by the intermediate frequency $f_{IF}$ and such that the second local signal will be at a frequency higher than that of the RF signal used for communication in the band B by the intermediate frequency $f_{IF}$.

Obviously, the same effect can be achieved when each of the frequencies is set such that the relationship between the first and second local signals and the bands A and B is changed from that shown in FIG. 13A to that shown in any of FIGS. 13B, 13C and 13D.

The radio communication apparatuses shown in FIGS. 2, 3 and 4 are equipped with the oscillators 91, 92 and 93, respectively, to generate the first local signal, the second local signal or both of them.

However, the present invention is not limited to such configurations and, for example, a CW signal generated by the oscillator 9 may be used in stead of a local signal at a predetermined frequency obtained by the oscillator 91, 92 or 93.

Figure 5:
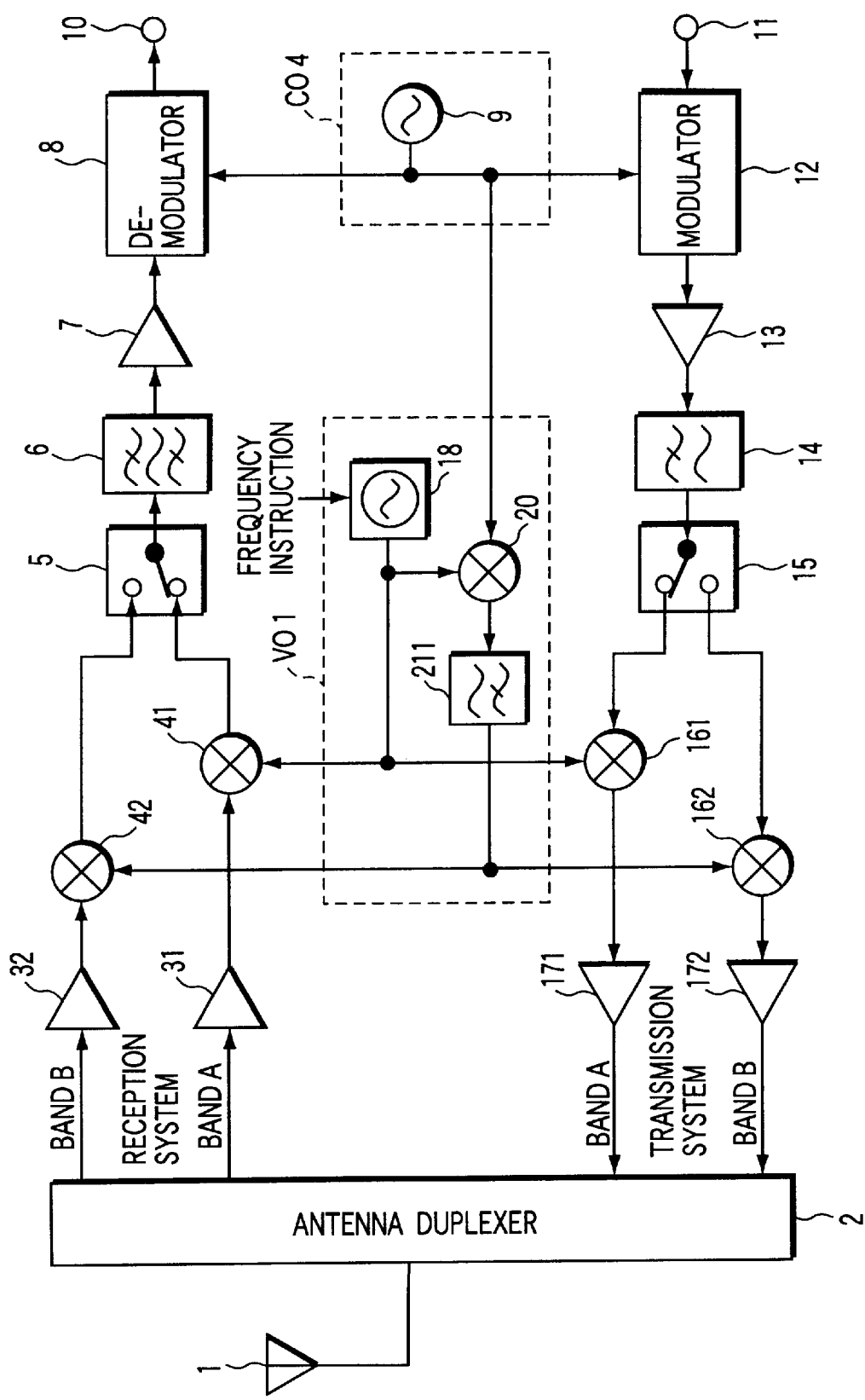
FIG. 5 is a circuit diagram showing a configuration of a radio communication apparatus which is based on the configuration of the radio communication apparatus shown in FIG. 2 except that the local signal generation portion is improved.

The radio communication apparatus shown in FIG. 5 has a configuration in which a CW signal is generated by the oscillator 9 in stead of the oscillator 91 of the local signal generation portion VO1 of the radio communication apparatus shown in FIG. 2.

In a radio communication apparatus having such a configuration, reception can be performed by causing only one synthesizer 18 to operate using the oscillator 9 for modulation and demodulation when reception signals in two bands are to be received on a quickly switched basis or simultaneously without operating two synthesizers as in the prior art. Therefore, reception can be performed without increasing power consumption.

Similarly, transmission can be performed by causing only one synthesizer 181 to operate even when transmission signals in two bands are to be transmitted on a quickly switched basis or simultaneously. Thus, there is no increase in power consumption.

When there are relationships between the frequency $f_1$ of the first local signal, the intermediate frequency $f_{IF}$, a frequency $f_A$ of the RF signal used for communication in the band A, a frequency $f_B$ of the RF signal used for communication in the band B and the frequency difference $f_{AB}$ as shown in FIGS. 14A through 14D in a radio communication apparatus having such a configuration, such relationships can be expressed by the equations shown below.

$$f_A = f_1 - f_{IF} \quad f_B = (f_1 + f_{AB}) - f_{IF} \quad (A)$$

$$f_A = f_1 + f_{IF} \quad f_B = (f_1 + f_{AB}) + f_{IF} \quad (B)$$

$$f_A = f_1 - f_{IF} \quad f_B = (f_1 + f_{AB}) + f_{IF} \quad (C)$$

$$f_A = f_1 + f_{IF} \quad f_B = (f_1 + f_{AB}) - f_{IF} \quad (D)$$

In FIG. 5, since $f_{AB} = f_{IF}$, then $$f_A = f_1 - f_{IF} \quad f_B = f_1 \quad (A)$$

$$f_A = f_1 + f_{IF} \quad f_B = f_1 + 2 \times f_{IF} \quad (B)$$

$$f_A = f_1 - f_{IF} \quad f_B = f_1 + 2 \times f_{IF} \quad (C)$$

$$f_A = f_1 + f_{IF} \quad f_B = f_1 \quad (D)$$

Figure 6:
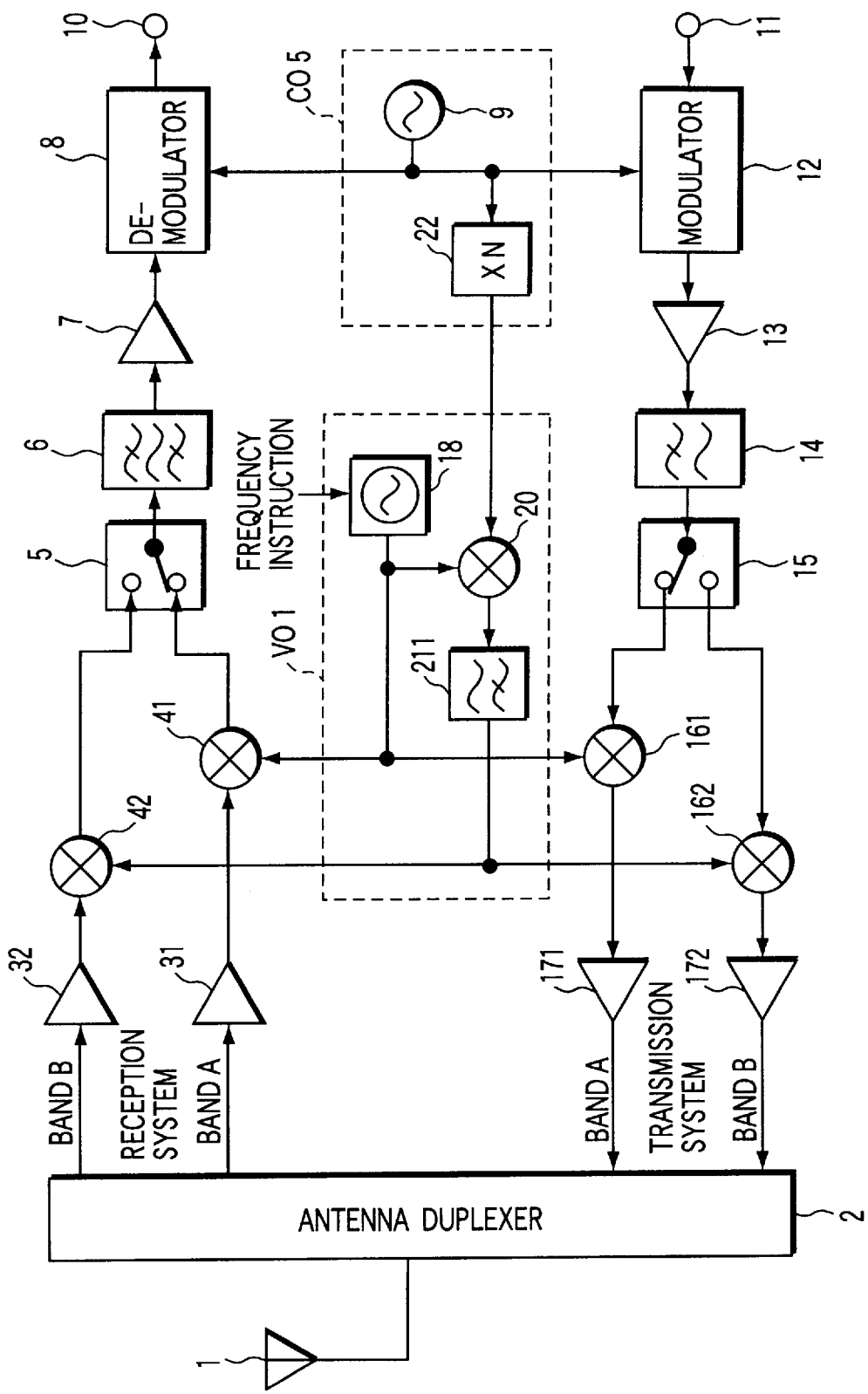
FIG. 6 is a circuit diagram showing another configuration of a radio communication apparatus which is based on the configuration of the radio communication apparatus shown in FIG. 2 except that the local signal generation portion is improved.

When there is any difference between the intermediate frequency $f_{IF}$ required for the demodulator 8 and modulator 12 and the frequency of the local signal required for frequency conversion at the local signal generation portion VO1, a local signal generation portion CO5 as shown in FIG. 6 may be used in place of the local signal generation portion CO4.

The local signal generation portion CO5 is added with a frequency multiplier (×N) 22 for converting (multiplying by N) the frequency of the CW signal generated by the oscillator 9 to supply a frequency-converted CW signal to the local signal generation portion VO1.

When there are relationships between the frequency $f_1$ of the first local signal, the intermediate frequency $f_{IF}$, the frequency $f_A$, the frequency $f_B$ and the frequency difference $f_{AB}$ as shown in FIGS. 14A through 14D in a radio communication apparatus having such a frequency multiplier 22, such relationships can be expressed by the equations shown below.

$$f_A = f_1 - f_{IF} \quad f_B = (f_1 + N \times f_{AB}) - f_{IF} \quad (A)$$

$$f_A = f_1 + f_{IF} \quad f_B = (f_1 + N \times f_{AB}) + f_{IF} \quad (B)$$

$$f_A = f_1 - f_{IF} \quad f_B = (f_1 + N \times f_{AB}) + f_{IF} \quad (C)$$

$$f_A = f_1 + f_{IF} \quad f_B = (f_1 + N \times f_{AB}) - f_{IF} \quad (D)$$

In FIG. 6, since $f_{AB} = f_{IF}$, then $$f_A = f_1 - f_{IF} \quad f_B = f_1 + (N-1) \times f_{IF} \quad (A)$$

$$f_A = f_1 + f_{IF} \quad f_B = f_1 + (N+1) \times f_{IF} \quad (B)$$

$$f_A = f_1 - f_{IF} \quad f_B = f_1 + (N+1) \times f_{IF} \quad (C)$$

$$f_A = f_1 + f_{IF} \quad f_B = f_1 + (N-1) \times f_{IF} \quad (D)$$

Figure 7:
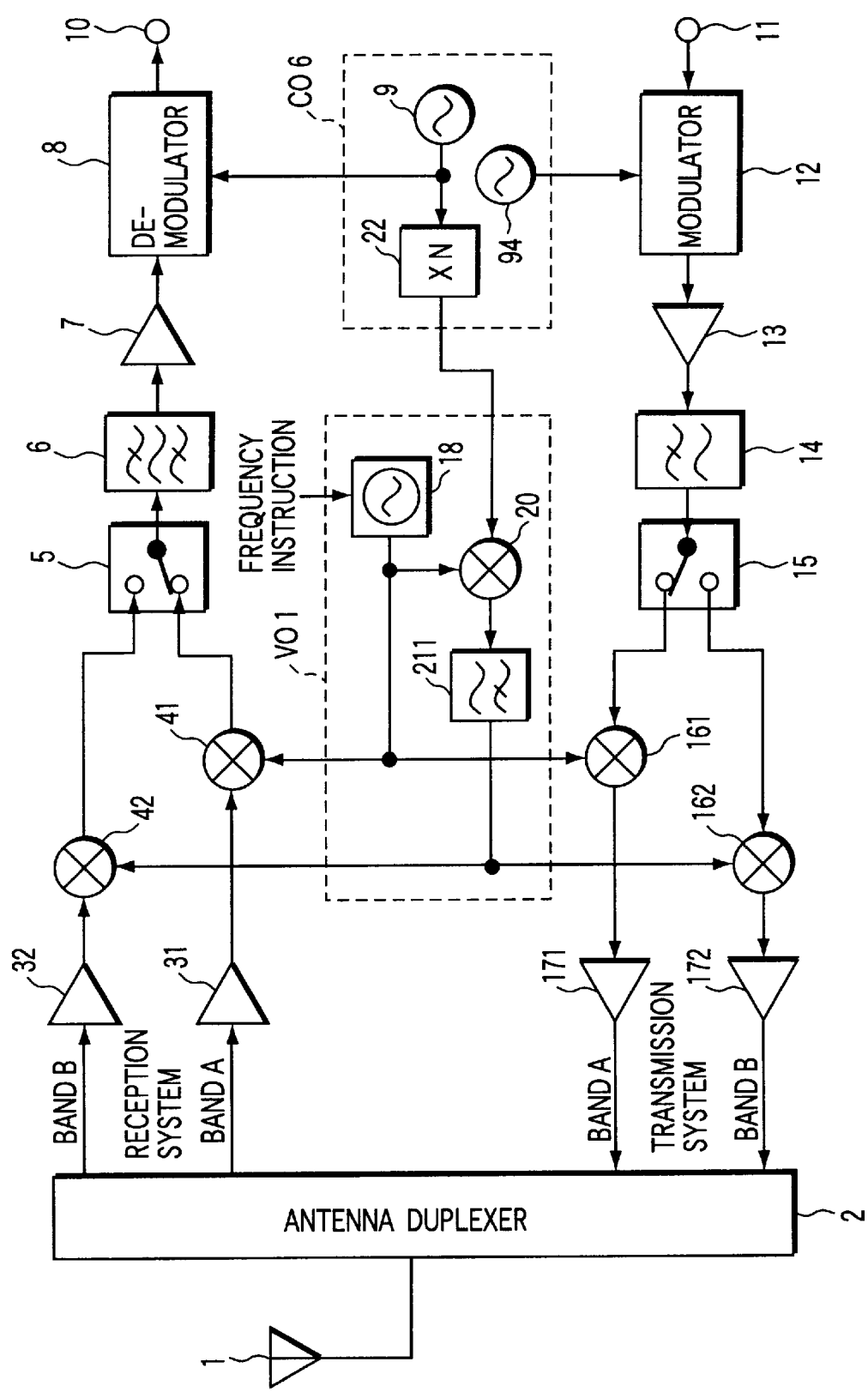
FIG. 7 is a circuit diagram showing still another configuration of a radio communication apparatus which is based on the configuration of the radio communication apparatus shown in FIG. 2 except that the local signal generation portion is improved.

Further, as shown in FIG. 7, a local signal generation portion CO6 may be provided in stead of the local signal generation portion CO5 shown in FIG. 6. The local signal generation portion CO6 supplies the CW signal generated by the oscillator 9 to the demodulator 8 and the frequency multiplier 22, and a CW signal is supplied to the modulator 12 from another oscillator 94 which is newly provided.

A radio communication apparatus having such a configuration can receive reception signals in two bands on a quickly switched basis or simultaneously in preparation for an incoming call or hand-over by causing only one synthesizer 18 to operate like the radio communication apparatus shown in FIG. 6. In addition, there is no need for causing the transmission system including the oscillator 94 to operate during such reception. Thus, a reduction in power consumption can be achieved.

Let us assume here that, in a radio communication apparatus having the configuration shown in FIG. 7, the frequency of the CW signal generated by the oscillator 9 is represented by $f_{R \times IF}$; the frequency of the CW signal generated by the oscillator 94 is represented by $f_{T \times IF}$; the frequency of a transmission RF signal in the band A is represented by $f_{T \times A}$; the frequency of a reception RF signal in the band A is represented by $f_{R \times A}$; the frequency of a transmission RF signal in the band B is represented by $f_{T \times B}$; and the frequency of a reception RF signal in the band B is represented by $f_{R \times B}$. When there are relationships as shown in FIGS. 14A through 14D between those frequencies, the relationships can be expressed by the following equations.

$$f_{R \times A} = f_1 - f_{R \times IF} \quad f_B = f_1 + N \times f_{R \times IF} - f_{R \times IF}$$

$$f_{T \times A} = f_1 - f_{T \times IF} \quad f_B = f_1 + N \times f_{R \times IF} - f_{T \times IF} \quad (A)$$

$$f_{R \times A} = f_1 + f_{R \times IF} \quad f_B = f_1 + N \times f_{R \times IF} + f_{R \times IF}$$

$$f_{T \times A} = f_1 + f_{T \times IF} \quad f_B = f_1 + N \times f_{R \times IF} + f_{T \times IF} \quad (B)$$

$$f_{R \times A} = f_1 - f_{R \times IF} \quad f_B = f_1 + N \times f_{R \times IF} + f_{R \times IF}$$

$$f_{T \times A} = f_1 - f_{T \times IF} \quad f_B = f_1 + N \times f_{R \times IF} + f_{T \times IF} \quad (C)$$

$$f_{R \times A} = f_1 + f_{R \times IF} \quad f_B = f_1 + N \times f_{R \times IF} - f_{R \times IF}$$

$$f_{T \times A} = f_1 + f_{T \times IF} \quad f_B = f_1 + N \times f_{R \times IF} - f_{T \times IF} \quad (D)$$

They can be rearranged as follows.

$$f_{R \times A} = f_1 - f_{R \times IF} \quad f_B = f_1 + (N-1) \times f_{R \times IF}$$

$$f_{T \times A} = f_1 - f_{T \times IF} \quad f_B = f_1 + N \times f_{R \times IF} - f_{T \times IF} \quad (A)$$

$$f_{R \times A} = f_1 + f_{R \times IF} \quad f_B = f_1 + (N+1) \times f_{R \times IF}$$

$$f_{T \times A} = f_1 + f_{T \times IF} \quad f_B = f_1 + N \times f_{R \times IF} + f_{T \times IF} \quad (B)$$

$$f_{R \times A} = f_1 - f_{R \times IF} \quad f_B = f_1 + (N+1) \times f_{R \times IF}$$

$$f_{T \times A} = f_1 - f_{T \times IF} \quad f_B = f_1 + N \times f_{R \times IF} + f_{T \times IF} \quad (C)$$

$$f_{R \times A} = f_1 + f_{R \times IF} \quad f_B = f_1 + (N-1) \times f_{R \times IF}$$

$$f_{T \times A} = f_1 + f_{T \times IF} \quad f_B = f_1 + N \times f_{R \times IF} - f_{T \times IF} \quad (D)$$

Figure 8:
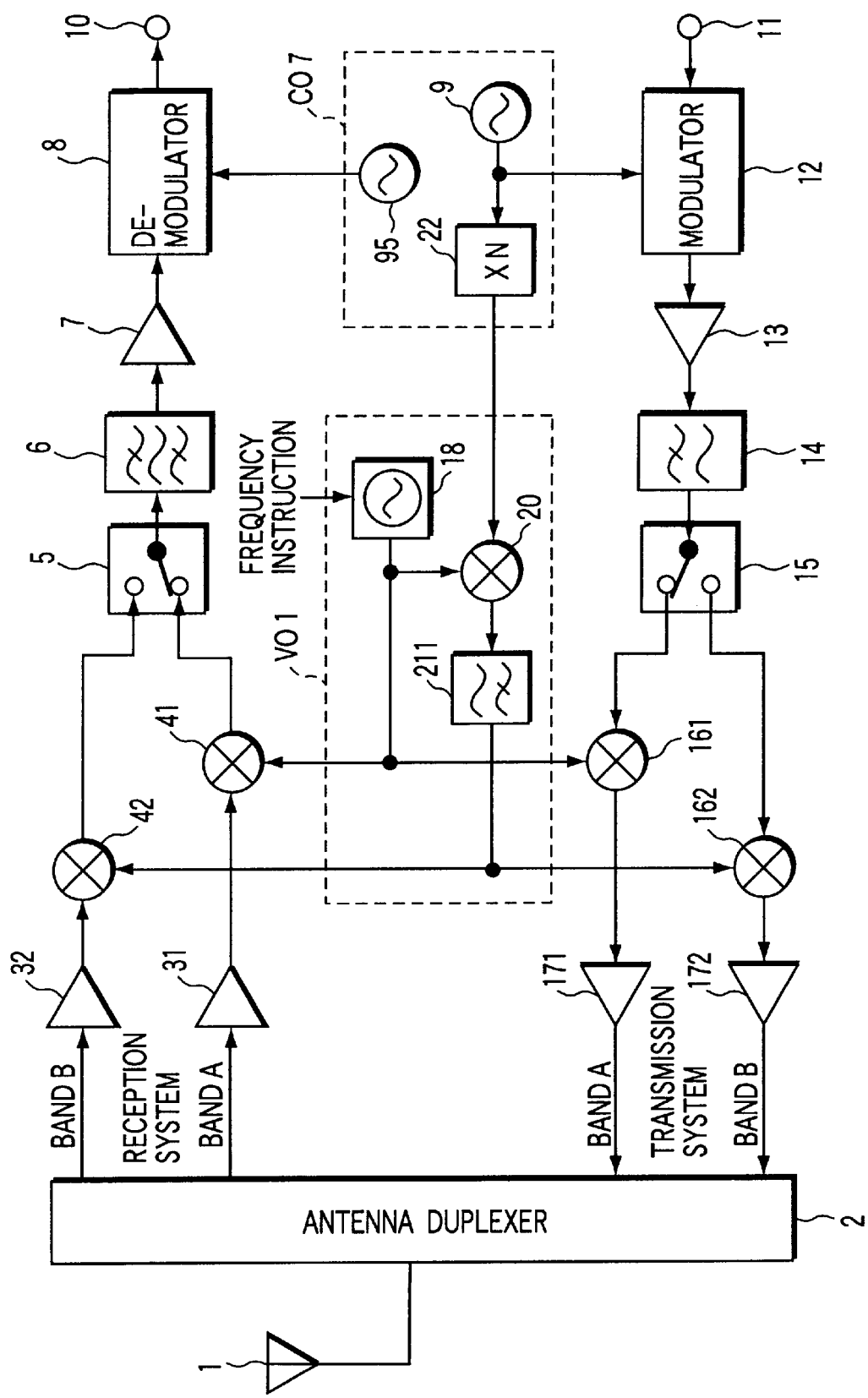
FIG. 8 is a circuit diagram showing still another configuration of a radio communication apparatus which is based on the configuration of the radio communication apparatus shown in FIG. 2 except that the local signal generation portion is improved.

Further, as shown in FIG. 8, a local signal generation portion CO7 may be provided in stead of the local signal generation portion CO5 shown in FIG. 6. The local signal generation portion CO7 supplies the CW signal generated by the oscillator 9 to the modulator 12 and the frequency multiplier 22, and a CW signal is supplied to the demodulator 8 from another oscillator 95 which is newly provided.

A radio communication apparatus having such a configuration can perform transmission in two bands on a quickly switched basis or simultaneously by causing only one synthesizer 18 to operate like the radio communication apparatus shown in FIG. 6. In addition, there is no need for causing the reception system including the oscillator 95 to operate during such transmission. Thus, a reduction in power consumption can be achieved.

Let us assume here that, in a radio communication apparatus having the configuration shown in FIG. 8, the frequency of the CW signal generated by the oscillator 95 is represented by $f_{R \times IF}$; the frequency of the CW signal generated by the oscillator 9 is represented by $f_{T \times IF}$; the frequency of a transmission RF signal in the band A is represented by $f_{T \times A}$; the frequency of a reception RF signal in the band A is represented by $f_{R \times A}$; the frequency of a transmission RF signal in the band B is represented by $f_{T \times B}$; and the frequency of a reception RF signal in the band B is represented by $f_{R \times B}$. When there are relationships as shown in FIGS. 14A through 14D between those frequencies, relationships can be expressed by the following equations.

$$f_{R \times A} = f_1 - f_{R \times IF} \quad f_B = f_1 + N \times f_{T \times IF} - f_{R \times IF}$$

$$f_{T \times A} = f_1 - f_{T \times IF} \quad f_B = f_1 + N \times f_{T \times IF} - f_{T \times IF} \tag{A}$$

$$f_{R \times A} = f_1 + f_{R \times IF} \quad f_B = f_1 + N \times f_{T \times IF} + f_{R \times IF}$$

$$f_{T \times A} = f_1 + f_{T \times IF} \quad f_B = f_1 + N \times f_{T \times IF} + f_{T \times IF} \tag{B}$$

$$f_{R \times A} = f_1 - f_{R \times IF} \quad f_B = f_1 + N \times f_{T \times IF} + f_{R \times IF}$$

$$f_{T \times A} = f_1 + f_{T \times IF} \quad f_B = f_1 + N \times f_{T \times IF} + f_{T \times IF} \tag{C}$$

$$f_{R \times A} = f_1 + f_{R \times IF} \quad f_B = f_1 + N \times f_{T \times IF} - f_{R \times IF}$$

$$f_{T \times A} = f_1 + f_{T \times IF} \quad f_B = f_1 + N \times f_{T \times IF} - f_{T \times IF} \tag{D}$$

They can be rearranged as follows.

$$f_{R \times A} = f_1 - f_{R \times IF} \quad f_B = f_1 + N \times f_{T \times IF} - f_{R \times IF}$$

$$f_{T \times A} = f_1 - f_{T \times IF} \quad f_B = f_1 + (N-1) \times f_{T \times IF} \tag{A}$$

$$f_{R \times A} = f_1 + f_{R \times IF} \quad f_B = f_1 + N \times f_{T \times IF} + f_{R \times IF}$$

$$f_{T \times A} = f_1 + f_{T \times IF} \quad f_B = f_1 + (N+1) \times f_{T \times IF} \tag{B}$$

$$f_{R \times A} = f_1 - f_{R \times IF} \quad f_B = f_1 + N \times f_{T \times IF} + f_{R \times IF}$$

$$f_{T \times A} = f_1 - f_{T \times IF} \quad f_B = f_1 + (N+1) \times f_{T \times IF} \tag{C}$$

$$f_{R \times A} = f_1 + f_{R \times IF} \quad f_B = f_1 + N \times f_{T \times IF} - f_{R \times IF}$$

$$f_{T \times A} = f_1 + f_{T \times IF} \quad f_B = f_1 + (N-1) \times f_{T \times IF} \tag{D}$$

Figure 9:
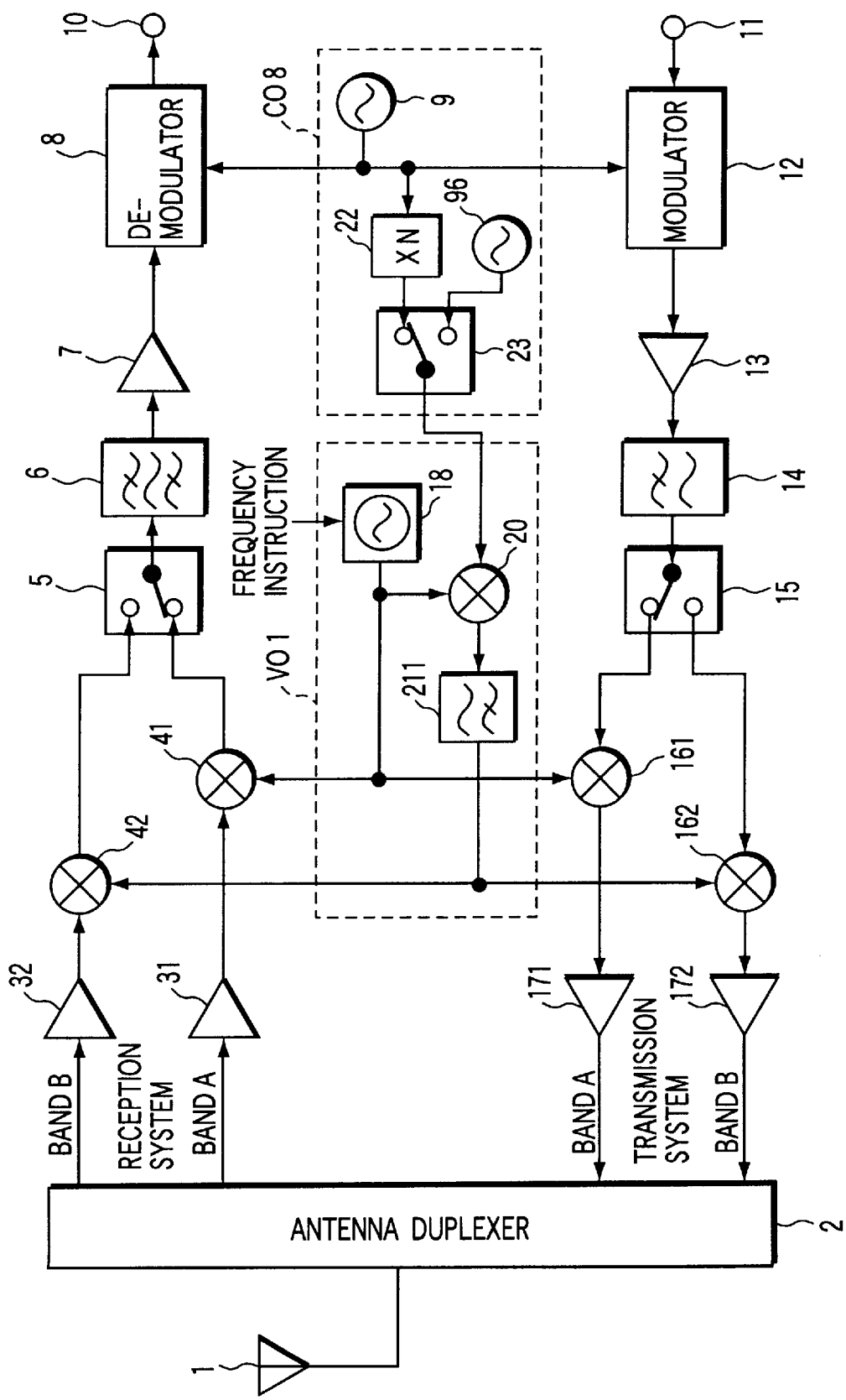
FIG. 9 is a circuit diagram showing still another configuration of a radio communication apparatus which is based on the configuration of the radio communication apparatus shown in FIG. 2 except that the local signal generation portion is improved.

Further, as shown in FIG. 9, a local signal generation portion CO8 may be provided in stead of the local signal generation portion CO5 shown in FIG. 6. The local signal generation portion CO8 comprises an oscillator 9, an oscillator 96, a frequency multiplier 22 and a switch 23.

A CW signal generated by the oscillator 9 is input to the demodulator 8, the modulator 12 and the frequency multiplier 22. In response, the frequency multiplier 22 outputs the CW signal to a first input terminal of the switch 23 after multiplying the frequency thereof by N.

A local signal generated by the oscillator 96 is input to a second input terminal of the switch 23. The switch 23 is switched under control of a control portion which is not shown to output the output of the frequency multiplier 22 to the local signal generation portion VO1 during reception and to output the output of the oscillator 96 to the local signal generation portion VO1 during transmission.

In a radio communication apparatus having such a configuration, the same effect as in the radio communication apparatus shown in FIG. 6 can be achieved, and the width of the variable band provided by the synthesizer 18 can be narrowed during transmission compared to that in the radio communication apparatus shown in FIG. 6 because the second local signal can be generated using the local signal generated by the oscillator 96.

Let us assume here that, in a radio communication apparatus having the configuration shown in FIG. 9, the frequency of the local signal generated by the oscillator 96 is represented by $f_{shift}$; the frequency (intermediate frequency) of the CW signal generated by the oscillator 9 is represented by $f_{IF}$; the frequency of a transmission RF signal in the band A is represented by $f_{T \times A}$; the frequency of a reception RF signal in the band A is represented by $f_{R \times A}$; the frequency of a transmission RF signal in the band B is represented by $f_{T \times B}$; and the frequency of a reception RF signal in the band B is represented by $f_{R \times B}$. When there are relationships as shown in FIGS. 14A through 14D between those frequencies, the relationships can be expressed by the following equations.

$$f_{R \times A} = f_1 - f_{IF} \quad f_B = f_1 + N \times f_{IF} - f_{IF}$$

$$f_{T \times A} = f_1 - f_{IF} \quad f_B = f_1 + N \times f_{shift} - f_{IF} \tag{A}$$

$$f_{R \times A} = f_1 + f_{IF} \quad f_B = f_1 + N \times f_{IF} + f_{IF}$$

$$f_{T \times A} = f_1 + f_{IF} \quad f_B = f_1 + N \times f_{shift} + f_{IF} \tag{B}$$

$$f_{R \times A} = f_1 - f_{IF} \quad f_B = f_1 + N \times f_{IF} + f_{IF}$$

$$f_{T \times A} = f_1 - f_{IF} \quad f_B = f_1 + N \times f_{shift} + f_{IF} \tag{C}$$

$$f_{R \times A} = f_1 + f_{IF} \quad f_B = f_1 + N \times f_{IF} - f_{IF}$$

$$f_{T \times A} = f_1 + f_{IF} \quad f_B = f_1 + N \times f_{shift} - f_{IF} \tag{D}$$

They can be rearranged as follows.

$$f_{R \times A} = f_1 - f_{IF} \quad f_B = f_1 + (N-1) \times f_{IF}$$

$$f_{T \times A} = f_1 - f_{IF} \quad f_B = f_1 + N \times f_{shift} - f_{IF} \tag{A}$$

$$f_{R \times A} = f_1 + f_{IF} \quad f_B = f_1 + (N+1) \times f_{IF}$$

$$f_{T \times A} = f_1 + f_{IF} \quad f_B = f_1 + N \times f_{shift} + f_{IF} \tag{B}$$

$$f_{R \times A} = f_1 - f_{IF} \quad f_B = f_1 + (N+1) \times f_{IF}$$

$$f_{T \times A} = f_1 - f_{IF} \quad f_B = f_1 + N \times f_{shift} + f_{IF} \tag{C}$$

$$f_{R \times A} = f_1 + f_{IF} \quad f_B = f_1 + (N-1) \times f_{IF}$$

$$f_{T \times A} = f_1 + f_{IF} \quad f_B = f_1 + N \times f_{shift} - f_{IF} \tag{D}$$

Further, as shown in FIG. 10, a local signal generation portion CO9 may be provided in stead of the local signal generation portion CO5 shown in FIG. 6. The local signal generation portion CO9 comprises oscillators 97 and 98, frequency multipliers 221 (×N) and 222 (×M) and a switch 23.

The oscillator 97 generates a CW signal at an intermediate frequency and outputs it to the demodulator 8 and the frequency multiplier 221. The frequency multiplier 221 outputs the CW signal generated by the oscillator 97 to a first input terminal of the switch 23 after converting the frequency thereof (multiplying it thereof by N).

The oscillator 98 generates a CW signal at an intermediate frequency and outputs it to the modulator 12 and the frequency multiplier 222. The frequency multiplier 222 outputs the CW signal generated by the oscillator 98 to a second input terminal of the switch 23 after converting the frequency thereof (multiplying it by M).

The switch 23 is switched under control of a control portion which is not shown to output the signal from the frequency multiplier 221 input to the first input terminal thereof to the local signal generation portion VO1 during reception and to output the signal from the frequency multiplier 222 input to the second input terminal thereof to the local signal generation portion VO1 during transmission.

In a radio communication apparatus having such a configuration, the same effect as in the radio communication apparatus shown in FIG. 6 can be achieved, and power consumption can be reduced because it is possible to operate only the transmission system during transmission and only the reception system during reception.

Let us assume here that, in a radio communication apparatus having the configuration shown in FIG. 10, the frequency of the CW signal generated by the oscillator 97 is represented by $f_{R \times IF}$; the frequency of the CW signal generated by the oscillator 98 is represented by $f_{T \times IF}$; the frequency of a transmission RF signal in the band A is represented by $f_{T \times A}$; the frequency of a reception RF signal in the band A is represented by $f_{R \times A}$; the frequency of a transmission RF signal in the band B is represented by $f_{T \times B}$; and the frequency of a reception RF signal in the band B is represented by $f_{R \times B}$. When there are relationships as shown in FIGS. 14A through 14D between those frequencies, the relationships can be expressed by the following equations.

$f_{R \times A} = f_1 - f_{R \times IF}$  $f_B = f_1 + N \times f_{R \times IF} - f_{R \times IF}$ $f_{T \times A} = f_1 - f_{T \times IF}$  $f_B = f_1 + M \times f_{T \times IF} - f_{T \times IF}$  (A)

$f_{R \times A} = f_1 + f_{R \times IF}$  $f_B = f_1 + N \times f_{R \times IF} + f_{R \times IF}$ $f_{T \times A} = f_1 + f_{T \times IF}$  $f_B = f_1 + M \times f_{T \times IF} + f_{T \times IF}$  (B)

$f_{R \times A} = f_1 - f_{R \times IF}$  $f_B = f_1 + N \times f_{R \times IF} + f_{R \times IF}$ $f_{T \times A} = f_1 - f_{T \times IF}$  $f_B = f_1 + M \times f_{T \times IF} + f_{T \times IF}$  (C)

$f_{R \times A} = f_1 + f_{R \times IF}$  $f_B = f_1 + N \times f_{R \times IF} - f_{R \times IF}$ $f_{T \times A} = f_1 + f_{T \times IF}$  $f_B = f_1 + M \times f_{T \times IF} - f_{T \times IF}$  (D)

They can be rearranged as follows.

$f_{R \times A} = f_1 - f_{R \times IF}$  $f_B = f_1 + (N-1) \times f_{R \times IF}$ $f_{T \times A} = f_1 - f_{T \times IF}$  $f_B = f_1 + (M-1) \times f_{T \times IF}$  (A)

$f_{R \times A} = f_1 + f_{R \times IF}$  $f_B = f_1 + (N+1) \times f_{R \times IF}$ $f_{T \times A} = f_1 + f_{T \times IF}$  $f_B = f_1 + (M+1) \times f_{T \times IF}$  (B)

$f_{R \times A} = f_1 - f_{R \times IF}$  $f_B = f_1 + (N+1) \times f_{R \times IF}$ $f_{T \times A} = f_1 - f_{T \times IF}$  $f_B = f_1 + (M+1) \times f_{T \times IF}$  (C)

$f_{R \times A} = f_1 + f_{R \times IF}$  $f_B = f_1 + (N-1) \times f_{R \times IF}$ $f_{T \times A} = f_1 + f_{T \times IF}$  $f_B = f_1 + (M-1) \times f_{T \times IF}$  (D)

While the frequency multipliers 22, 221 and 222 in the above-described embodiments have been described as performing frequency conversion by multiplying an input CW signal by N, it goes without saying that the number N may be a decimal fraction provided that it is a positive number, i.e., the same effect can be achieved also by performing frequency division on the CW signal.

The radio communication apparatuses shown in FIGS. 5 through 10 have a configuration based on the radio communication apparatus shown in FIG. 2 except that they are respectively equipped with local signal generation portions CO4 through CO9 in stead of the local signal generation portion CO1.

The aspects of the invention shown in FIGS. 5 through 10 are not limited thereto, and the same effect can obviously achieved by radio communication apparatuses which are configured based on the radio communication apparatus shown in FIGS. 3 and 4 in stead of the radio communication apparatus shown in FIG. 2, except that the local signal generation portions CO4 through CO9 are provided in stead of the local signal generation portions CO2 and CO3.

The present invention may be implemented with various modifications without departing from the spirit of the invention.

As described above, according to the present invention, the frequency of a communication signal in a first communication band is converted using a first local oscillation signal generated by first local oscillation signal generation means, and the frequency of a communication signal in a second communication band is converted using a second local oscillation signal generated by mixing the first local oscillation signal with a local oscillation signal generated by second local oscillation signal generation means.

In another configuration according to the present invention, the frequency of a first local oscillation signal generated by first local oscillation signal generation means is converted by mixing it with a local oscillation signal generated by second local oscillation signal generation means; the result of this conversion is filtered to separate and output a high frequency side-band component signal and a low frequency side-band component signal included therein; and the frequencies of communication signals in first and second communication bands are converted using the respective side-band component signals.

In a radio communication apparatus having any of the above described configurations, the frequencies of communication signals in the two communication bands are converted using a first local oscillation signal generation means that can generate a local oscillation signal having a variable frequency, and a second local oscillation signal generation means that can generate a local oscillation signal having a predetermined frequency lower than the frequency of the local oscillation signal generated by the first local oscillation signal generation means.

Therefore, the present invention makes it possible to provide a radio communication apparatus in which power consumption is not increased, for example, even when communication bands used for two respective radio communications are received (transmitted) on a quickly switched basis or simultaneously because the reception (transmission) can be carried out by using a first local oscillation signal generation means that can generate a local oscillation signal having a variable frequency, and a second local oscillation signal generation means that can generate a local oscillation signal having a predetermined frequency lower than the frequency of the local oscillation signal generated by the first local oscillation signal generation means.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A radio communication apparatus which receives a first RF signal in a first communication band or a second RF signal in a second communication band, comprising:

first local oscillation signal generation means for generating a local oscillation signal at a variable frequency and outputting said local oscillation signal as a first local oscillation signal;

second local oscillation signal generation means for generating a local oscillation signal at a predetermined frequency;

local oscillation frequency conversion means for performing frequency conversion on said first local oscillation signal by mixing said first local oscillation signal with the local oscillation signal generated by said second local oscillation signal generation means and for outputting the result of the conversion as a second local oscillation signal;

first frequency conversion means for down-converting the received first RF signal into a communication signal by mixing the received first RF signal with the first local oscillation signal; and second frequency conversion means for down-converting the received second RF signal into the communication signal by mixing the received second RF signal with the second local oscillation signal.

2. The radio communication apparatus according to claim 1, wherein said second local oscillation signal generation means is means for generating a local oscillation signal used for demodulation of the communication signal.

3. The radio communication apparatus according to claim 2, wherein said second local oscillation signal generation means comprises:

an oscillator; and third frequency conversion means for multiplying the frequency of a signal output by said oscillator by N (N>0) and for setting the multiplied signal as the local oscillation signal at the predetermined frequency.

4. The radio communication apparatus according to claim 2, wherein said second local oscillation signal generation means comprises:

first and second oscillators;

third frequency conversion means for multiplying the frequency of a signal output by said first oscillator by N (N>0); and switch means for selectively outputting a signal output by said third frequency conversion means and a signal output by said second oscillator and for setting the outputted signal as the local oscillation signal at the predetermined frequency.

5. The radio communication apparatus according to claim 2, wherein said second local oscillation signal generation means comprises:

first and second oscillators;

third frequency conversion means for multiplying the frequency of a signal output by said first oscillator by N (N>0);

fourth frequency conversion means for multiplying the frequency of a signal output by said second oscillator by M (M>0); and switch means for selectively outputting a signal output by said third frequency conversion means and a signal output by said fourth frequency conversion means and for setting the outputted signal as the local oscillation signal at the predetermined frequency.

6. A radio communication apparatus which performs communication using at least either a first communication band used for a first radio communication system or a second communication band used for a second communication system, comprising:

first local oscillation signal generation means for generating a local oscillation signal at a variable frequency and outputting said local oscillation signal as a first local oscillation signal;

second local oscillation signal generation means for generating a local oscillation signal at a predetermined frequency;

local oscillation frequency conversion means for performing frequency conversion on said first local oscillation signal by mixing said first local oscillation signal with the local oscillation signal generated by said second local oscillation signal generation means and for outputting the result of the conversion as a second local oscillation signal;

first frequency conversion means for up-converting a communication signal into a first RF signal in the first communication band by mixing the communication signal with the first local oscillation signal; and second frequency conversion means for up-converting the communication signal into a second RF signal in the second communication band by mixing the communication signal with the second local oscillation signal.

7. The radio communication apparatus according to claim 6, wherein said second local oscillation signal generation means is means for generating a local oscillation signal used for modulation of the communication signal.

8. The radio communication apparatus according to claim 7, wherein said second local oscillation signal generation means comprises:

an oscillator; and third frequency conversion means for multiplying the frequency of a signal output by said oscillator by N (N>0) and for setting the multiplied signal as the local oscillation signal at the predetermined frequency.

9. The radio communication apparatus according to claim 7, wherein said second local oscillation signal generation means comprises:

first and second oscillators;

third frequency conversion means for multiplying the frequency of a signal output by said first oscillator by N (N>0); and switch means for selectively outputting a signal output by said third frequency conversion means and a signal output by said second oscillator and for setting the outputted signal as the local oscillation signal at the predetermined frequency.

10. The radio communication apparatus according to claim 7, wherein said second local oscillation signal generation means comprises:

first and second oscillators;

third frequency conversion means for multiplying the frequency of a signal output by said first oscillator by N (N>0);

fourth frequency conversion means for multiplying the frequency of a signal output by said second oscillator by M (M>0); and switch means for selectively outputting a signal output by said third frequency conversion means and a signal output by said fourth frequency conversion means and for setting the outputted signal as the local oscillation signal at the predetermined frequency.

11. The radio communication apparatus according to claim 1 or 6, wherein said local oscillation frequency conversion means comprise:
   mixing means for mixing said first local oscillation signal with the local oscillation signal generated by said second local oscillation generation means; and
   filter means for outputting high frequency sideband components from among high frequency side-band components and low frequency side-band components output based on the result of mixing by said mixing means as said second local oscillation signal.

12. The radio communication apparatus according to claim 1 or 6, wherein said local oscillation frequency conversion means comprise:
   mixing means for mixing said first local oscillation signal with the local oscillation signal generated by said second local oscillation generation means; and
   filter means for outputting low frequency side-band components from among high frequency side-band components and low frequency side-band components output based on the result of mixing by said mixing means as said second local oscillation signal.

13. The radio communication apparatus according to claim 1 or 6, further comprising:
   control means for selecting one of the first and second communication bands and generating a frequency instruction signal including the selected communication band;
   wherein a frequency of the first local oscillation signal is determined based on the generated frequency instruction signal.

14. A radio communication apparatus which receives a first RF signal in either a first communication band or a second RF signal in a second communication band, comprising:
   first local oscillation signal generation means for generating a first local oscillation signal at a variable frequency;
   second local oscillation signal generation means for generating a second local oscillation signal at a predetermined frequency;
   local oscillation frequency conversion means for performing frequency conversion on the first local oscillation signal by mixing the first local oscillation signal with the second local oscillation signal;
   first filter means for outputting low frequency side-band components, as a third local oscillation signal, from among high frequency side-band components and low frequency side-band components output as a result of the conversion at said local oscillation frequency conversion means;
   second filter means for outputting high frequency side-band components, as a fourth local oscillation signal, from among high frequency side-band components and low frequency side-band components output as a result of the conversion at said local oscillation frequency conversion means;
   first frequency conversion means for down-converting the received first RF signal into a communication signal by mixing the received first RF signal with the third local oscillation signal; and
   second frequency conversion means for down-converting the received second RF signal into the communication signal by mixing the received second RF signal with the fourth local oscillation signal.

15. The radio communication apparatus according to claim 14, wherein said second local oscillation signal generation means is means for generating a local oscillation signal used for demodulation of the communication signal.

16. The radio communication apparatus according to claim 15, wherein said second local oscillation signal generation means comprises:
   an oscillator; and
   third frequency conversion means for multiplying the frequency of a signal output by said oscillator by N (N>0) and for setting the multiplied signal as the local oscillation signal at the predetermined frequency.

17. The radio communication apparatus according to claim 15, wherein said second local oscillation signal generation means comprises:
   first and second oscillators;
   third frequency conversion means for multiplying the frequency of a signal output by said first oscillator by N (N>0); and
   switch means for selectively outputting a signal output by said third frequency conversion means and a signal output by said second oscillator and for setting the outputted signal as the local oscillation signal at the predetermined frequency.

18. The radio communication apparatus according to claim 15, wherein said second local oscillation signal generation means comprises:
   first and second oscillators;
   third frequency conversion means for multiplying the frequency of a signal output by said first oscillator by N (N>0);
   fourth frequency conversion means for multiplying the frequency of a signal output by said second oscillator by M (M>0); and
   switch means for selectively outputting a signal output by said third frequency conversion means and a signal output by said fourth frequency conversion means and for setting the outputted signal as the local oscillation signal at the predetermined frequency.

19. A radio communication apparatus which performs communication using at least either a first communication band used for a first radio communication system or a second communication band used for a second communication system, comprising:
   first local oscillation signal generation means for generating a first local oscillation signal at a variable frequency;
   second local oscillation signal generation means for generating a second local oscillation signal at a predetermined frequency;
   local oscillation frequency conversion means for performing frequency conversion on the first local oscillation signal by mixing the first local oscillation signal with the second local oscillation signal;
   first filter means for outputting low frequency side-band components, as a third local oscillation signal, from among high frequency side-band components and low frequency side-band components output as a result of the conversion at said local oscillation frequency conversion means;
   second filter means for outputting high frequency side-band components, as a fourth local oscillation signal, from among high frequency side-band components and low frequency side-band components output as a result of the conversion at said local oscillation frequency conversion means;

first frequency conversion means for up-converting a communication signal into a first RF signal in the first communication band by mixing the communication signal with the third local oscillation signal; and second frequency conversion means for up-converting the communication signal into a second RF signal in the second communication band by mixing the communication signal with the fourth local oscillation signal.

20. The radio communication apparatus according to claim 19, wherein said second local oscillation signal generation means is means for generating a local oscillation signal used for modulation of the communication signal.

21. The radio communication apparatus according to claim 20, wherein said second local oscillation signal generation means comprises:

an oscillator; and third frequency conversion means for multiplying the frequency of a signal output by said oscillator by N (N>0) and for setting the multiplied signal as the local oscillation signal at the predetermined frequency.

22. The radio communication apparatus according to claim 20, wherein said second local oscillation signal generation means comprises:

first and second oscillators;

third frequency conversion means for multiplying the frequency of a signal output by said first oscillator by N (N>0); and switch means for selectively outputting a signal output by said third frequency conversion means and a signal output by said second oscillator and for setting the outputted signal as the local oscillation signal at the predetermined frequency.

23. The radio communication apparatus according to claim 20, wherein said second local oscillation signal generation means comprises:

first and second oscillators;

third frequency conversion means for multiplying the frequency of a signal output by said first oscillator by N (N>0);

fourth frequency conversion means for multiplying the frequency of a signal output by said second oscillator by M (M>0); and switch means for selectively outputting a signal output by said third frequency conversion means and a signal output by said fourth frequency conversion means and for setting the outputted signal as the local oscillation signal at the predetermined frequency.

24. The radio communication apparatus according to claim 14 or 19, further comprising:

control means for selecting one of the first and second communication bands and generating a frequency instruction signal including the selected communication band;

wherein a frequency of the first local oscillation signal is determined based on the generated frequency instruction signal.

25. A radio communication apparatus which performs communication using at least either a first communication band used for a first radio communication system or a second communication band used for a second communication system, comprising:

first local oscillation signal generation means for generating a first local oscillation signal at a variable frequency;

second local oscillation signal generation means for generating a second local oscillation signal at a predetermined frequency;

local frequency conversion means for converting the first local oscillation signal into a third local oscillation signal by mixing the first local oscillation signal with the second local oscillation signal;

first frequency conversion means for up-converting a communication signal into a first RF signal in the first communication band by mixing the communication signal with the first local oscillation signal; and second frequency conversion means for up-converting the communication signal into a second RF signal in the second communication band by mixing the communication signal with the third local oscillation signal.

26. A radio communication apparatus which receives a first RF signal in a first communication band or a second RF signal in a second communication band, comprising:

first local oscillation signal generation means for generating a first local oscillation signal at a variable frequency;

second local oscillation signal generation means for generating a second local oscillation signal at a predetermined frequency;

local frequency conversion means for converting the first local oscillation signal into a third local oscillation signal by mixing the first local oscillation signal with the second local oscillation signal;

first frequency conversion means for down-converting the received first RF signal into a communication signal by mixing the received first RF signal with the first local oscillation signal; and second frequency conversion means for down-converting the received second RF signal into the communication signal by mixing the received second RF signal with the third local oscillation signal.

* * * * *